(12) United States Patent
Zhang et al.

(10) Patent No.: US 12,062,311 B2
(45) Date of Patent: Aug. 13, 2024

(54) DISPLAY PANEL, METHOD FOR DRIVING SHIFT REGISTER UNIT THEREOF, AND SHIFT REGISTER

(71) Applicant: BOE TECHNOLOGY GROUP CO., LTD., Beijing (CN)

(72) Inventors: Hao Zhang, Beijing (CN); Jiangnan Lu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/795,033

(22) PCT Filed: Aug. 30, 2021

(86) PCT No.: PCT/CN2021/115307
§ 371 (c)(1),
(2) Date: Jul. 25, 2022

(87) PCT Pub. No.: WO2023/028749
PCT Pub. Date: Mar. 9, 2023

(65) Prior Publication Data
US 2024/0221565 A1 Jul. 4, 2024

(51) Int. Cl.
*G09G 3/20* (2006.01)
*G11C 19/28* (2006.01)
(52) U.S. Cl.
CPC ............ *G09G 3/20* (2013.01); *G11C 19/28* (2013.01); *G09G 2300/0408* (2013.01); *G09G 2310/0286* (2013.01)

(58) Field of Classification Search
CPC ... G09G 2310/0286; G09G 2310/0289; G09G 2300/0408
See application file for complete search history.

(56) References Cited

U.S. PATENT DOCUMENTS

| | | | |
|---|---|---|---|
| 2011/0001752 A1* | 1/2011 | Ohta | G09G 3/3677 345/530 |
| 2014/0346520 A1 | 11/2014 | Kim et al. | |
| 2016/0055814 A1 | 2/2016 | Yang et al. | |
| 2018/0357965 A1 | 12/2018 | Chung et al. | |
| 2021/0335180 A1* | 10/2021 | Sun | G11C 19/28 |

FOREIGN PATENT DOCUMENTS

| | | |
|---|---|---|
| CN | 103236273 A | 8/2013 |
| CN | 110070822 A | 7/2019 |
| CN | 111415624 A | 7/2020 |
| CN | 112951140 A | 6/2021 |
| KR | 20140139308 A | 12/2014 |

* cited by examiner

*Primary Examiner* — Robin J Mishler
(74) *Attorney, Agent, or Firm* — Lippes Mathias LLP

(57) ABSTRACT

Provided is a display panel. The display panel includes a substrate including a display region and a non-display region surrounding the display region; and a shift register unit, disposed in the non-display region; wherein the shift register unit includes a first shift circuit and a second shift circuit; wherein the first shift circuit is coupled to a first clock terminal, a second clock terminal, an input signal terminal, a first power terminal, a second power terminal, and a shift node; and the second shift circuit is coupled to the shift node, the first clock terminal, the second clock terminal, a third clock terminal, an enable control terminal, an output control terminal, the first power terminal, the second power terminal, and an output terminal.

20 Claims, 15 Drawing Sheets

In an input phase, a first shift circuit controls a potential of a shift node to be a second potential in response to a first clock signal at a first potential, a second clock signal at the second potential, an input signal at the first potential, a first power signal at the first potential, and a second power signal at the second potential; and a second shift circuit controls a first power terminal to be conducted with an output terminal in response to the second potential of the shift node, the first clock signal at the first potential, the second clock signal at the second potential, the first power signal, and the second power signal, controls a third clock terminal to be conducted with the output terminal in response to an output control signal at the first potential, and controls a second power terminal to be non-conducted with the output terminal in response to an enable control signal at the second potential — 2001

In an output phase, the first shift circuit controls the potential of the shift node to be the first potential in response to the first clock signal at the second potential, the second clock signal at the first potential, the input signal at the second potential, the first power signal, and the second power signal; and the second shift circuit controls the first power terminal to be non-conducted with the output terminal in response to the first potential of the shift node, the first clock signal at the second potential, the second clock signal at the first potential, the first power signal, and the second power signal, controls the third clock terminal to be conducted with the output terminal in response to the output control signal at the first potential, and controls the second power terminal to be non-conducted with the output terminal in response to the enable control signal at the second potential. — 2002

In a first pull-down phase, the first shift circuit controls the potential of the shift node to be the second potential in response to the first clock signal at the first potential, the second clock signal at the second potential, the input signal at the second potential, the first power signal, and the second power signal; and the second shift circuit controls the first power terminal to be conducted with the output terminal in response to the second potential of the shift node, the first clock signal at the first potential, the second clock signal at the second potential, the first power signal, and the second power signal, controls the third clock terminal to be non-conducted with the output terminal in response to the output control signal at the second potential, and controls the second power terminal to be non-conducted with the output terminal in response to the enable control signal at the second potential — 2003

FIG. 20

2001 — In an input phase, a first shift circuit controls a potential of a shift node to be a second potential in response to a first clock signal at a first potential, a second clock signal at the second potential, an input signal at the first potential, a first power signal at the first potential, and a second power signal at the second potential; and a second shift circuit controls a first power terminal to be conducted with an output terminal in response to the second potential of the shift node, the first clock signal at the first potential, the second clock signal at the second potential, the first power signal, and the second power signal, controls a third clock terminal to be conducted with the output terminal in response to an output control signal at the first potential, and controls a second power terminal to be non-conducted with the output terminal in response to an enable control signal at the second potential 2002 — In an output phase, the first shift circuit controls the potential of the shift node to be the first potential in response to the first clock signal at the second potential, the second clock signal at the first potential, the input signal at the second potential, the first power signal, and the second power signal; and the second shift circuit controls the first power terminal to be non-conducted with the output terminal in response to the first potential of the shift node, the first clock signal at the second potential, the second clock signal at the first potential, the first power signal, and the second power signal, controls the third clock terminal to be conducted with the output terminal in response to the output control signal at the first potential, and controls the second power terminal to be non-conducted with the output terminal in response to the enable control signal at the second potential.

2003 — In a first pull-down phase, the first shift circuit controls the potential of the shift node to be the second potential in response to the first clock signal at the first potential, the second clock signal at the second potential, the input signal at the second potential, the first power signal, and the second power signal; and the second shift circuit controls the first power terminal to be conducted with the output terminal in response to the second potential of the shift node, the first clock signal at the first potential, the second clock signal at the second potential, the first power signal, and the second power signal, controls the third clock terminal to be non-conducted with the output terminal in response to the output control signal at the second potential, and controls the second power terminal to be non-conducted with the output terminal in response to the enable control signal at the second potential 2004 — In a second pull-down phase, the first shift circuit controls the potential of the shift node to be the second potential in response to the first clock signal at the second potential, the second clock signal at the second potential, the input signal at the first potential, the first power signal, and the second power signal; and the second shift circuit controls the first power terminal to be non-conducted with the output terminal in response to the second potential of the shift node, the first clock signal at the second potential, the second clock signal at the second potential, the first power signal, and the second power signal, controls the third clock terminal to be non-conducted with the output terminal in response to the output control signal at the second potential, and controls the second power terminal to be conducted with the output terminal in response to the enable control signal at the first potential

FIG. 21

DISPLAY PANEL, METHOD FOR DRIVING SHIFT REGISTER UNIT THEREOF, AND SHIFT REGISTER

CROSS-REFERENCE TO RELATED APPLICATION

This application is a U.S. national stage of international application No. PCT/CN2021/115307, filed on Aug. 30, 2021, the content of which is incorporated herein by reference in its entirety.

TECHNICAL FIELD

The present disclosure relates to the field of display technologies, and in particular, to a display panel, a method for driving a shift register unit thereof, and a shift register.

BACKGROUND

A shift register usually includes a plurality of cascaded shift register units. Each shift register unit may provide a light-emission control signal to a row of pixel units. The plurality of cascaded shift register units can drive pixel units in a display apparatus row by row so as to display images.

SUMMARY

Embodiments of the present disclosure provide a display panel, a method for driving a shift register unit thereof, and a shift register. The technical solutions are as follows.

In an aspect, a display panel is provided. The display panel includes:
- a substrate, including a display region and a non-display region surrounding the display region; and
- a shift register unit, disposed in the non-display region; wherein the shift register unit includes a first shift circuit and a second shift circuit; wherein
- the first shift circuit is coupled to a first clock terminal, a second clock terminal, an input signal terminal, a first power terminal, a second power terminal, and a shift node, and the first shift circuit is configured to control a potential of the shift node in response to a first clock signal provided by the first clock terminal, a second clock signal provided by the second clock terminal, an input signal provided by the input signal terminal, a first power signal provided by the first power terminal, and a second power signal provided by the second power terminal; and
- the second shift circuit is coupled to the shift node, the first clock terminal, the second clock terminal, a third clock terminal, an enable control terminal, an output control terminal, the first power terminal, the second power terminal, and an output terminal, and the second shift circuit is configured to control the first power terminal to be conducted with or non-conducted with the output terminal in response to the potential of the shift node, the first clock signal, the second clock signal, the first power signal, and the second power signal, control the third clock terminal to be conducted with or non-conducted with the output terminal in response to an output control signal provided by the output control terminal, and control the second power terminal to be conducted with or non-conducted with the output terminal in response to an enable control signal provided by the enable control terminal.

Optionally, the second shift circuit is configured to: control the second power terminal to be non-conducted with the output terminal in response to the enable control signal at a second potential in a display phase of a pixel circuit coupled to the shift register unit; and control the second power terminal to be conducted with the output terminal in response to the enable control signal at a first potential in a blanking phase of the pixel circuit coupled to the shift register unit.

Optionally, the second shift circuit includes a first output control sub-circuit, a second output control sub-circuit, and a first output sub-circuit; wherein
- the first output control sub-circuit is coupled to the shift node, the first clock terminal, the second clock terminal, the first power terminal, the second power terminal, and the output terminal, and the first output control sub-circuit is configured to control the first power terminal to be conducted with or non-conducted with the output terminal in response to the potential of the shift node, the first clock signal, the second clock signal, the first power signal, and the second power signal;
- the second output control sub-circuit is coupled to the enable control terminal, the second power terminal, and the output terminal, and the second output control sub-circuit is configured to control the second power terminal to be conducted with or non-conducted with the output terminal in response to the enable control signal; and
- the first output sub-circuit is coupled to the output control terminal, the third clock terminal, and the output terminal, and the first output sub-circuit is configured to control the third clock terminal to be conducted with or non-conducted with the output terminal in response to the output control signal.

Optionally, the second output control sub-circuit includes a first transistor; wherein
a gate of the first transistor is coupled to the enable control terminal, a first electrode of the first transistor is coupled to the second power terminal, and a second electrode of the first transistor is coupled to the output terminal.

Optionally, the first output sub-circuit includes a second transistor, and the second transistor is a single-gate transistor; wherein
a gate of the second transistor is coupled to the output control terminal, a first electrode of the second transistor is coupled to the third clock terminal, and a second electrode of the second transistor is coupled to the output terminal.

Optionally, the first output control sub-circuit includes a first denoising control sub-circuit, a second denoising control sub-circuit, and a denoising sub-circuit; wherein
the first denoising control sub-circuit is coupled to the shift node, the first clock terminal, the second clock terminal, the first power terminal, the second power terminal, and a pull-down reference node, and the first denoising control sub-circuit is configured to control the second power terminal to be conducted with or non-conducted with the pull-down reference node in response to the potential of the shift node, control the first power terminal to be conducted with or non-conducted with the pull-down reference node in response to the first clock signal, and control a potential of the pull-down reference node based on the second clock signal;

the second denoising control sub-circuit is coupled to the shift node, the first power terminal, the second power terminal, the pull-down reference node, and a first pull-down node, and the second denoising control sub-circuit is configured to control the second power terminal to be conducted with or non-conducted with the first pull-down node in response to the potential of the shift node, control the pull-down reference node to be conducted with or non-conducted with the first pull-down node in response to the potential of the pull-down reference node, and control a potential of the first pull-down node based on the first power signal; and the denoising sub-circuit is coupled to the first pull-down node, the first power terminal, and the output terminal, and the denoising sub-circuit is configured to control the first power terminal to be conducted with or non-conducted with the shift node in response to the potential of the first pull-down node.

Optionally, the denoising sub-circuit includes a third transistor, and the third transistor is a single-gate transistor; wherein
  a gate of the third transistor is coupled to the first pull-down node, a first electrode of the third transistor is coupled to the first power terminal, and a second electrode of the third transistor is coupled to the output terminal.

Optionally, the first denoising control sub-circuit includes a fourth transistor, a fifth transistor, and a first capacitor; and the second denoising control sub-circuit includes a sixth transistor, a seventh transistor, and a second capacitor; wherein
  a gate of the fourth transistor and a gate of the sixth transistor are both coupled to the shift node, a first electrode of the fourth transistor and a first electrode of the sixth transistor are both coupled to the second power terminal, and a second electrode of the fourth transistor is coupled to the pull-down reference node, and a second electrode of the sixth transistor is coupled to the first pull-down node;
  a gate of the fifth transistor is coupled to the first clock terminal, a first electrode of the fifth transistor is coupled to the first power terminal, and a second electrode of the fifth transistor is coupled to the pull-down reference node;
  a gate and a first electrode of the seventh transistor are both coupled to the pull-down reference node, and a second electrode of the seventh transistor is coupled to the first pull-down node;
  one end of the first capacitor is coupled to the pull-down reference node and the other end of the first capacitor is coupled to the second clock terminal; and
  one end of the second capacitor is coupled to the first pull-down node and the other end of the second capacitor is coupled to the first power terminal.

Optionally, the first shift circuit includes an input sub-circuit, a control sub-circuit, and a second output sub-circuit; wherein
  the input sub-circuit is coupled to the first clock terminal, the first power terminal, the input signal terminal, a pull-up node, and a second pull-down node, and the input sub-circuit is configured to control the first power terminal to be conducted with or non-conducted with the pull-up node and control the input signal terminal to be conducted with or non-conducted with the second pull-down node in response to the first clock signal;

the control sub-circuit is coupled to the pull-up node, the second pull-down node, the first clock terminal, the second clock terminal, and the second power terminal, and the control sub-circuit is configured to control the second power terminal to be conducted with or non-conducted with the second pull-down node in response to a potential of the pull-up node and the second clock signal, and control the first clock terminal to be conducted with or non-conducted with the pull-up node in response to a potential of the second pull-down node; and the second output sub-circuit is coupled to the pull-up node, the second pull-down node, the first power terminal, the second power terminal, the second clock terminal, and the shift node, and the second output sub-circuit is configured to control the second power terminal to be conducted with or non-conducted with the shift node in response to the potential of the pull-up node, and control the second clock terminal to be conducted with or non-conducted with the shift node in response to the potential of the second pull-down node and the first power signal.

Optionally, the input sub-circuit includes an eighth transistor and a ninth transistor; the control sub-circuit includes a tenth transistor, an eleventh transistor, and a twelfth transistor; the second output sub-circuit includes a thirteenth transistor, a fourteenth transistor, a fifteenth transistor, a third capacitor, and a fourth capacitor; wherein
  a gate of the eighth transistor and a gate of the ninth transistor are both coupled to the first clock terminal, a first electrode of the eighth transistor is coupled to the first power terminal, and a second electrode of the eighth transistor is coupled to the pull-up node, a first electrode of the ninth transistor is coupled to the input signal terminal, and a second electrode of the ninth transistor is coupled to the second pull-down node;
  a gate of the tenth transistor is coupled to the second pull-down node, a first electrode of the tenth transistor is coupled to the first clock terminal, and a second electrode of the tenth transistor is coupled to the pull-up node;
  a gate of the eleventh transistor is coupled to the pull-up node, a first electrode of the eleventh transistor is coupled to the second power terminal, and a second electrode of the eleventh transistor is coupled to a first electrode of the twelfth transistor, and a gate of the twelfth transistor is coupled to the second clock terminal and a second electrode of the twelfth transistor is coupled to the second pull-down node;
  a gate of the thirteenth transistor is coupled to the pull-up node, a first electrode of the thirteenth transistor is coupled to the second power terminal, and a second electrode of the thirteenth transistor is coupled to the shift node;
  a gate of the fourteenth transistor is coupled to the first power terminal, a first electrode of the fourteenth transistor is coupled to the second pull-down node, and a second electrode of the fourteenth transistor is coupled to a gate of the fifteenth transistor, and a first electrode of the fifteenth transistor is coupled to the second clock terminal and a second electrode of the fifteenth transistor is coupled to the shift node;
  one end of the third capacitor is coupled to the pull-up node and the other end of the third capacitor is coupled to the second power terminal; and one end of the fourth capacitor is coupled to the gate of the fifteenth transistor and the other end of the fourth capacitor is coupled to the shift node.

Optionally, the output control terminal is coupled to the gate of the fifteenth transistor.

Optionally, transistors in the shift register unit are all N-type transistors.

Optionally, the shift register unit includes a semiconductor layer, a first conductive layer, a second conductive layer, and a third conductive layer which are disposed on a side of the substrate; wherein
- the semiconductor layer at least includes a channel region, a source region, and a drain region of at least one transistor in the shift register unit;
- the first conductive layer at least includes a gate of at least one transistor and a first capacitive electrode of at least one capacitor in the shift register unit, the gate and a channel region of the at least one transistor being overlapped;
- the second conductive layer at least includes a second capacitive electrode of at least one capacitor in the shift register unit, the second capacitive electrode and a first capacitive electrode of the at least one capacitor being overlapped; and
- the third conductive layer at least includes a plurality of signal lines, and a source and a drain of at least one transistor in the shift register unit; wherein the source and a source region of the at least one transistor are coupled, and the drain and a drain region of the at least one transistor are coupled; and the plurality of signal lines are coupled to signal terminals coupled to the shift register unit, respectively.

Optionally, the plurality of signal lines include a first group of signal lines, a second group of signal lines, and a third group of signal lines that are sequentially spaced in a first direction; wherein
- the first group of signal lines includes a first power line coupled to the first power terminal;
- the second group of signal lines includes an enable control line coupled to the enable control terminal; and
- the third group of signal lines includes the first power line; wherein the first group of signal lines, a first group of transistors in the shift register unit, a first group of capacitors in the shift register unit, the second group of signal lines, a second group of transistors in the shift register unit, a second group of capacitors in the shift register unit, and the third group of signal lines are sequentially arranged in the first direction; and at least one of the plurality of signal lines extends in a second direction, the first direction being a direction from the non-display region to the display region, and the second direction intersecting the first direction.

Optionally, the first group of signal lines further includes an input signal line coupled to the input signal terminal, a first clock signal line coupled to the first clock terminal, and a second clock signal line coupled to the second clock terminal;
- the second group of signal lines further includes a second power line coupled to the second power terminal, the first clock signal line, and the second clock signal line; and
- the third group of signal lines further includes a third clock signal line coupled to the third clock terminal; and
- wherein in the first direction, the input signal line, the first clock signal line, the second clock signal line, and the first power line in the first group of signal lines are sequentially arranged, the second power line, the enable control line, the second clock signal line, and the first clock signal line in the second group of signal lines are sequentially arranged, and the first power line and the third clock signal line in the third group of signal lines are sequentially arranged.

Optionally, the first group of transistors includes a sixth transistor, a ninth transistor, an eighth transistor, a tenth transistor, an eleventh transistor, a twelfth transistor, a thirteenth transistor, and a fifteenth transistor in the shift register unit;
- the first group of capacitors includes a third capacitor and a fourth capacitor in the shift register unit;
- the second group of transistors includes a first transistor, a second transistor, a third transistor, a fourth transistor, the fifth transistor, and a seventh transistor in the shift register unit; and
- the second group of capacitors includes a first capacitor and a second capacitor in the shift register unit.

Optionally, the fourth capacitor is disposed between the tenth transistor and the thirteenth transistor, and the tenth transistor, the fourth capacitor, and the thirteenth transistor are sequentially arranged in a direction close to the second group of signal lines;
- the fifteenth transistor, the ninth transistor, the sixth transistor, and the third capacitor are sequentially arranged in the direction close to the second group of signal lines;
- the eleventh transistor is disposed between the fifteenth transistor and the tenth transistor, and farther from the first group of signal lines than the fifteenth transistor is; and
- the twelfth transistor and the eighth transistor are disposed between the ninth transistor and the fourth capacitor, sequentially arranged in the direction close to the second group of signal lines, and closer to the tenth transistor than the eleventh transistor is.

Optionally, the fourth transistor is disposed between the first capacitor and the second capacitor, and the first capacitor, the fourth transistor, and the second capacitor are sequentially arranged in a direction close to the third group of signal lines;
- the fifth transistor, the first transistor, and the first capacitor are sequentially arranged in the second direction; and the seventh transistor and the fourteenth transistor are disposed between the fifth transistor and the first transistor, and are sequentially arranged in the direction close to the third group of signal lines; and
- the second transistor and the third transistor are sequentially arranged in the second direction and are disposed on a side of the fourteenth transistor away from the second group of signal lines, and the second transistor is farther from the fourth transistor than the third transistor is.

Optionally, a semiconductor layer of the fifth transistor, a semiconductor layer of the seventh transistor, and a semiconductor layer of the fourteenth transistor are of an integral structure; and
- a semiconductor layer of the second transistor and a semiconductor layer of the third transistor are of an integral structure.

Optionally, a gate of the fifteenth transistor and a gate of the ninth transistor are of an integral structure;
- a first capacitive electrode of the third capacitor, a gate of the eighth transistor, and the gate of the second transistor are of an integral structure;

a gate of the seventh transistor and a gate of the fourteenth transistor are of an integral structure;

a gate of the third transistor and a first capacitive electrode of the second capacitor are of an integral structure;

a gate of the fourth transistor and a first capacitive electrode of the first capacitor are of an integral structure; and a gate of the tenth transistor and a first capacitive electrode of the fourth capacitor are of an integral structure.

Optionally, in the shift register unit, orthographic projections of a gate of the second transistor and/or a gate of the third transistor on the substrate are strip-shaped and extend in the first direction; and orthographic projections of gates of the transistors other than the transistors with strip-shaped gates on the substrate are U-shaped.

In another aspect, a method for driving a shift register unit in a display panel is provided. The method is applied to the shift register unit described in the above aspect and includes:

in an input phase, controlling, by a first shift circuit, a potential of a shift node to be a second potential in response to a first clock signal at a first potential, a second clock signal at the second potential, an input signal at the first potential, a first power signal at the first potential, and a second power signal at the second potential; and controlling, by a second shift circuit, a first power terminal to be conducted with an output terminal in response to the second potential of the shift node, the first clock signal at the first potential, the second clock signal at the second potential, the first power signal and the second power signal, a third clock terminal to be conducted with the output terminal in response to an output control signal at the first potential, and a second power terminal to be non-conducted with the output terminal in response to an enable control signal at the second potential, wherein a potential of a third clock signal provided by the third clock terminal is the first potential;

in an output phase, controlling, by the first shift circuit, the potential of the shift node to be the first potential in response to the first clock signal at the second potential, the second clock signal at the first potential, the input signal at the second potential, the first power signal, and the second power signal; and controlling, by the second shift circuit, the first power terminal to be non-conducted with the output terminal in response to the first potential of the shift node, the first clock signal at the second potential, the second clock signal at the first potential, the first power signal and the second power signal, the third clock terminal to be conducted with the output terminal in response to the output control signal at the first potential, and the second power terminal to be non-conducted with the output terminal in response to the enable control signal at the second potential, wherein the potential of the third clock signal is the second potential; and in a first pull-down phase, controlling, by the first shift circuit, the potential of the shift node to be the second potential in response to the first clock signal at the first potential, the second clock signal at the second potential, the input signal at the second potential, the first power signal, and the second power signal; and controlling, by the second shift circuit, the first power terminal to be conducted with the output terminal in response to the second potential of the shift node, the first clock signal at the first potential, the second clock signal at the second potential, the first power signal and the second power signal, the third clock terminal to be non-conducted with the output terminal in response to the output control signal at the second potential, and the second power terminal to be non-conducted with the output terminal in response to the enable control signal at the second potential, wherein the potential of the third clock signal is the first potential;

wherein the input phase, the output phase, and the first pull-down phase are performed in a display phase of a pixel circuit coupled to the shift register unit.

Optionally, after the first pull-down phase, the method further includes:

in a second pull-down phase, controlling, by the first shift circuit, the potential of the shift node to be the second potential in response to the first clock signal at the second potential, the second clock signal at the second potential, the input signal at the first potential, the first power signal and the second power signal; and controlling, by the second shift circuit, the first power terminal to be non-conducted with the output terminal in response to the second potential of the shift node, the first clock signal at the second potential, the second clock signal at the second potential, the first power signal and the second power signal, the third clock terminal to be non-conducted with the output terminal in response to the output control signal at the second potential, and the second power terminal to be conducted with the output terminal in response to the enable control signal at the first potential, wherein the potential of the third clock signal is the second potential;

wherein the second pull-down phase is performed in a blanking phase of the pixel circuit.

Optionally, a cycle of the second clock signal is the same as a cycle of the third clock signal, and in the output phase, a duty cycle of the second clock signal is greater than a duty cycle of the third clock signal.

In still another aspect, a shift register is provided. The shift register includes at least two cascaded shift register units, and the shift register unit includes the shift register unit in the display panel described in the above aspect.

A shift node of the shift register unit at each stage is coupled to an input signal terminal of the shift register unit at a next stage, and an output terminal of the shift register unit at each stage is coupled to a target signal line, wherein the target signal line is a light-emission control line coupled to a pixel circuit in the display panel.

BRIEF DESCRIPTION OF THE DRAWINGS

To describe the technical solutions in the embodiments of the present disclosure more clearly, the following briefly describes the accompanying drawings required for describing the embodiments. Apparently, the accompanying drawings in the following description show merely some embodiments of the present disclosure, and those of ordinary skill in the art may still derive other drawings from these accompanying drawings without creative efforts.

FIG. 20 is a flowchart of a method for driving a shift register unit according to an embodiment of the present disclosure;

FIG. 21 is a flowchart of another method for driving a shift register unit according to an embodiment of the present disclosure;

DETAILED DESCRIPTION

To make the objectives, technical solutions, and advantages of the present disclosure clearer, the present disclosure will be further described in detail below with reference to the accompanying drawings.

Transistors in all embodiments of the present disclosure may be field effect transistors or other devices having same characteristics. The transistors in the embodiments of the present disclosure are mainly switch transistors based on their functions in circuits. Because a source and drain of the switch transistor are symmetrical, the source and drain are interchangeable. In the embodiments of the present disclosure, the source is referred to as a first terminal and the drain is referred to as a second terminal, or the drain is referred to as the first terminal and the source is referred to as the second terminal. According to the form in the accompanying drawings, a middle terminal of the transistor is a gate, a signal input terminal is the source, and a signal output terminal is the drain. In addition, the switch transistor in the embodiments of the present disclosure may a P-type switch transistor or an N-type switch transistor. The P-type switch transistor is turned on when the gate is at a low level and turned off when the gate is at a high level. The N-type switch transistor is turned on when the gate is at the high level and turned off when the gate is at the low level. In addition, a plurality of signals in the embodiments of the present disclosure each have an effective potential and an ineffective potential. The effective potential and the ineffective potential only represent that the potential of the signal has two state variables, but do not represent that the effective potential or the ineffective potential in the whole text has a specific value.

In the related art, the shift register unit includes two shift circuits. One of the shift circuits is coupled to a plurality of signal terminals and a shift node, and is configured to control a potential of the shift node based on signals provided by the signal terminals. The other shift circuit is coupled to the plurality of signal terminals, the shift node, and an output terminal, and is configured to control a potential of the output terminal based on the signals provided by the signal terminals and the potential of the shift node. The output terminal is coupled to a row of pixel units.

However, in the related art, the shift register unit has a poor flexibility of controlling the potential of the output terminal.

Figure 1:
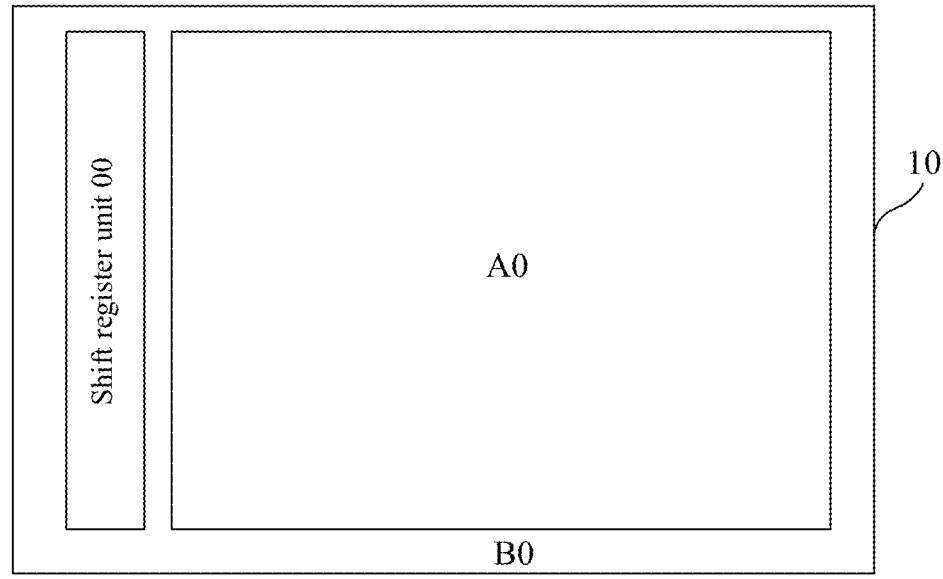
FIG. 1 is a schematic structural diagram of a display panel according to an embodiment of the present disclosure.

FIG. 1 is a schematic structural diagram of a display panel according to an embodiment of the present disclosure. As shown in FIG. 1, the display panel includes a substrate 10 including a display region A0 and a non-display region B0, and a shift register unit 00 disposed in the non-display region B0.

Here, the display region A0 and the non-display region B0 surrounding the display region A0. That is, the display region A0 is surrounded by the non-display region B0. Certainly, in some embodiments, the non-display region B0 may only partially surround the display region A0. For example, referring to FIG. 1, only three of four sides of the display region A0 are surrounded by the non-display region B0.

Figure 2:
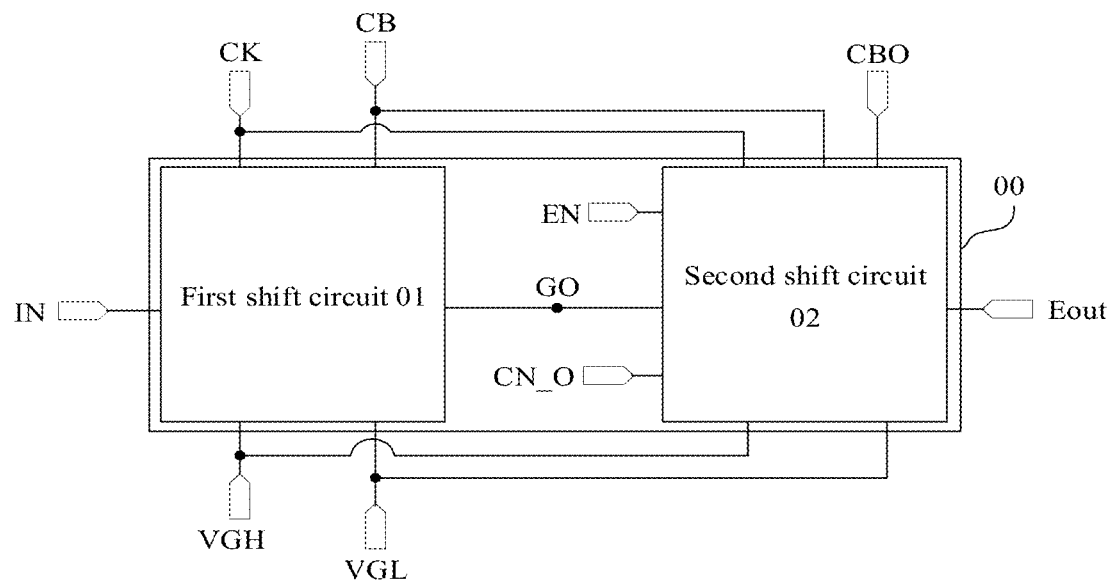
FIG. 2 is a schematic structural diagram of a shift register unit according to an embodiment of the present disclosure.

FIG. 2 is a schematic structural diagram of a shift register unit according to an embodiment of the present disclosure. As shown in FIG. 2, the shift register unit 00 includes a first shift circuit 01 and a second shift circuit 02.

The first shift circuit 01 is coupled to a first clock terminal CK, a second clock terminal CB, an input signal terminal IN, a first power terminal VGH, a second power terminal VGL, and a shift node G0. The first shift circuit 01 is configured to control a potential of the shift node G0 in response to a first clock signal provided by the first clock terminal CK, a second clock signal provided by the second clock terminal CB, an input signal provided by the input signal terminal IN, a first power signal provided by the first power terminal VGH, and a second power signal provided by the second power terminal VGL.

Optionally, the first power terminal VGH and the second power terminal VGL may be direct current (DC) power terminals, a potential of the first power signal may be a first potential, and a potential of the second power signal may be a second potential. The first potential may be an effective potential, the second potential may be an ineffective potential, and the first potential may be a high potential relative to the second potential. That is, the first potential may be higher than the second potential.

On this basis, for example, the first shift circuit 01 may control the potential of the shift node GO to be the second potential when the potential of the first clock signal and the potential of the input signal are both the first potential and the potential of the second clock signal is the second potential; and the first shift circuit 01 may control the potential of the shift node GO to be the first potential when the potential of the first clock signal and the potential of the input signal are both the second potential and the potential of the second clock signal is the first potential.

The second shift circuit 02 is coupled to the shift node GO, the first clock terminal CK, the second clock terminal CB, a third clock terminal CBO, an enable control terminal EN, an output control terminal CN_O, the first power terminal VGH, the second power terminal VGL, and an output terminal Eout. The second shift circuit 02 is configured to control the first power terminal VGH to be conducted with or non-conducted with the output terminal Eout in response to the potential of the shift node, the first clock signal, the second clock signal, the first power signal, and the second power signal, control the third clock terminal CBO to be conducted with or non-conducted with the output terminal Eout in response to an output control signal provided by the output control terminal CN_O, and control the second power terminal VGL to be conducted with or non-conducted with the output terminal Eout in response to an enable control signal provided by the enable control terminal EN.

For example, the second shift circuit 02 may control the first power terminal VGH to be conducted with the output terminal Eout when the potential of the shift node GO and the potential of the first clock signal are both the second potential and the potential of the second clock signal is the first potential. In this case, the first power terminal VGH may transmit the first power signal at the first potential to the output terminal Eout. The second shift circuit 02 may control the first power terminal VGH to be non-conducted with the output terminal Eout when the potential of the shift node GO and the potential of the second clock signal are both the first potential and the potential of the first clock signal is the second potential.

For another example, the second shift circuit 02 may further control the third clock terminal CBO to be conducted with the output terminal Eout when the potential of the output control signal is the first potential. In this case, the third clock terminal CBO may transmit a third clock signal to the output terminal Eout. The second shift circuit 02 may further control the third clock terminal CBO to be non-conducted with the output terminal Eout when the potential of the output control signal is the second potential.

For another example, the second shift circuit 02 may further control the second power terminal VGL to be conducted with the output terminal Eout when a potential of the enable control signal is the first potential. In this case, the second power terminal VGL may transmit the second power signal at the second potential to the output terminal Eout. The second shift circuit 02 may further control the second power terminal VGL to be non-conducted with the output terminal Eout when the potential of the enable control signal is the second potential.

In summary, the embodiments of the present disclosure provide a display panel. The shift register unit in the display panel includes the first shift circuit and the second shift circuit. The second shift circuit is coupled to the enable control terminal, the second power terminal, and the output terminal. The second shift circuit may control the second power terminal to be conducted with the output terminal under the control of the enable control terminal, that is, control the second power terminal to provide the second power signal to the output terminal, which improves flexibility of controlling the potential of the output terminal by the shift register unit, in comparison with the related art.

It can be learned in combination with the foregoing descriptions of the operating principle of the second shift circuit 02 that the second shift circuit 02 provided in the embodiments of the present disclosure may be configured to control the second power terminal VGL to be non-conducted with the output terminal Eout in response to the enable control signal at the second potential in a display phase of a pixel circuit coupled to the shift register unit. In this case, the second power terminal VGL cannot provide the second power signal at the second potential to the output terminal Eout. The second shift circuit 02 may be configured to control the second power terminal VGL to be conducted with the output terminal Eout in response to the enable control signal at the first potential in a blanking phase of the pixel circuit coupled to the shift register unit. In this case, the second power terminal VGL can transmit the second power signal at the second potential to the output terminal Eout. That is, the second shift circuit 02 may control the enable control terminal EN to provide the enable control signal at the second potential in the display phase, and control the enable control terminal EN to provide the enable control signal at the first potential in the blanking phase, to flexibly control the potential of the output terminal Eout and ensure that the signal at the second potential is reliably provided to the output terminal Eout in the blanking phase.

Figure 3:
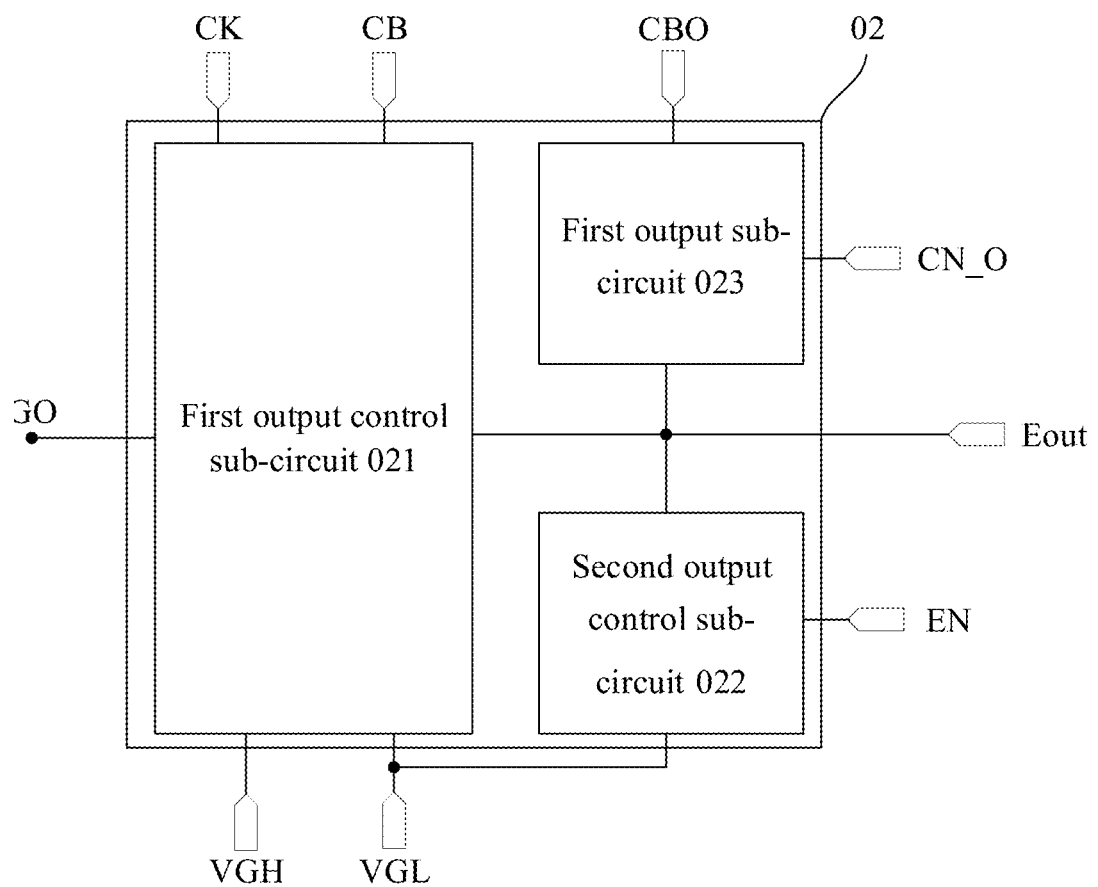
FIG. 3 is a schematic structural diagram of a second shift circuit according to an embodiment of the present disclosure.

FIG. 3 is a schematic structural diagram of a second shift circuit according to an embodiment of the present disclosure. As shown in FIG. 3, the second shift circuit 02 may include a first output control sub-circuit 021, a second output control sub-circuit 022, and a first output sub-circuit 023.

The first output control sub-circuit 021 may be coupled to the shift node GO, the first clock terminal CK, the second clock terminal CB, the first power terminal VGH, the second power terminal VGL, and the output terminal Eout. The first output control sub-circuit 021 may be configured to control the first power terminal VGH to be conducted with or non-conducted with the output terminal Eout in response to the potential of the shift node GO, the first clock signal, the second clock signal, the first power signal, and the second power signal.

For example, the first output control sub-circuit 021 may control the first power terminal VGH to be conducted with the output terminal Eout when the potential of the shift node GO and the potential of the first clock signal are both the second potential and the potential of the second clock signal is the first potential, and the first output control sub-circuit 021 may control the first power terminal VGH to be non-conducted with the output terminal Eout when the potential of the shift node GO and the potential of the second clock signal are both the first potential and the potential of the first clock signal is the second potential.

The second output control sub-circuit 022 may be coupled to the enable control terminal EN, the second power terminal VGL, and the output terminal Eout. The second output control sub-circuit 022 may be configured to control the second power terminal VGL to be conducted with or non-conducted with the output terminal Eout in response to the enable control signal.

For example, the second output control sub-circuit 022 may control the second power terminal VGL to be conducted with the output terminal Eout when the potential of the enable control signal is the first potential, and the second output control sub-circuit 022 may control the second power terminal VGL to be non-conducted with the output terminal Eout when the potential of the enable control signal is the second potential.

The first output sub-circuit 023 may be coupled to the output control terminal CN_O, the third clock terminal CBO, and the output terminal Eout. The first output sub-circuit 023 may be configured to control the third clock terminal CBO to be conducted with or non-conducted with from the output terminal Eout in response to the output control signal.

For example, the first output sub-circuit 023 may control the third clock terminal CBO to be conducted with the output terminal Eout when the potential of the output control signal is the first potential, and the first output sub-circuit 023 may control the third clock terminal CBO to be non-conducted with the output terminal Eout when the potential of the output control signal is the second potential.

Figure 4:
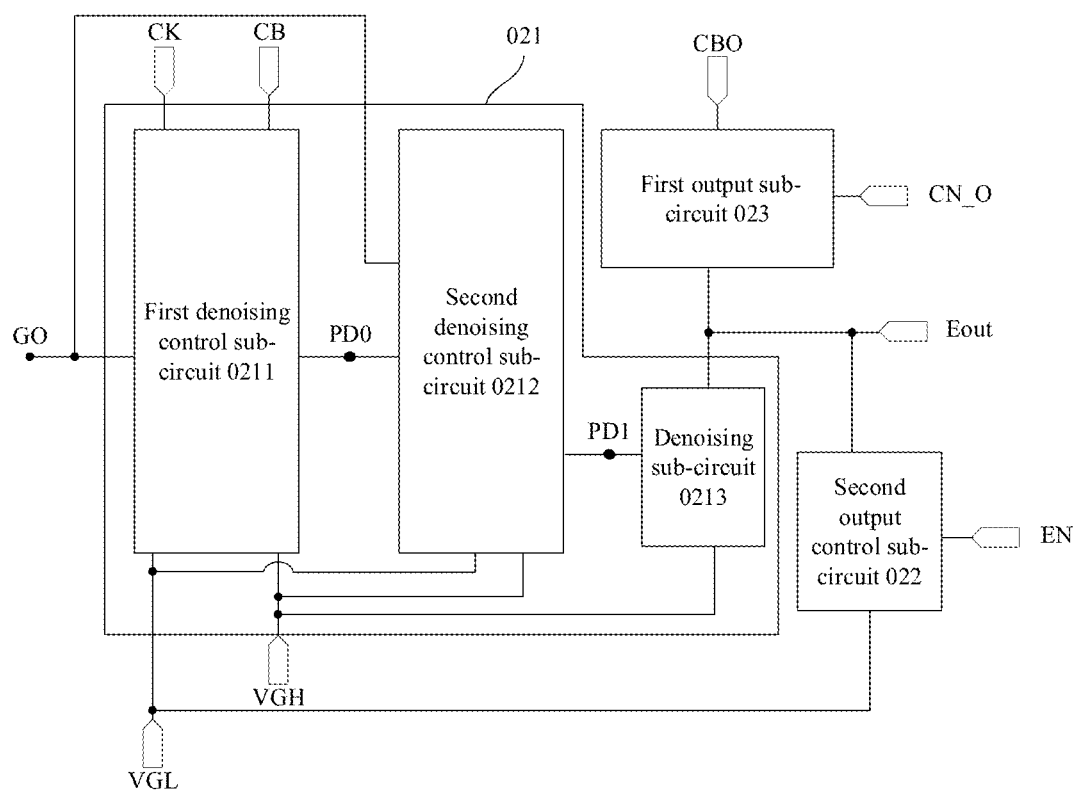
FIG. 4 is a schematic structural diagram of another second shift circuit according to an embodiment of the present disclosure.

FIG. 4 is a schematic structural diagram of another second shift circuit according to an embodiment of the present disclosure. As shown in FIG. 4, the first output control sub-circuit 021 may include a first denoising control sub-circuit 0211, a second denoising control sub-circuit 0212, and a denoising sub-circuit 0213.

The first denoising control sub-circuit 0211 may be coupled to the shift node GO, the first clock terminal CK, the second clock terminal CB, the first power terminal VGH, the second power terminal VGL, and a pull-down reference node PD0. The first denoising control sub-circuit 0211 may be configured to control the second power terminal VGL to be conducted with or non-conducted with the pull-down reference node PD0 in response to the potential of the shift node GO, control the first power terminal VGH to be conducted with or non-conducted with the pull-down reference node PD0 in response to the first clock signal, and control a potential of the pull-down reference node PD0 based on the second clock signal.

For example, the first denoising control sub-circuit 0211 may control the second power terminal VGL to be conducted with the pull-down reference node PD0 when the potential of the shift node GO is the first potential. In this case, the second power terminal VGL may transmit the second power signal at the second potential to the pull-down reference node PD0. In addition, the first denoising control sub-circuit 0211 may control the second power terminal VGL to be non-conducted with the pull-down reference node PD0 when the potential of the shift node GO is the second potential.

Moreover, the first denoising control sub-circuit 0211 may control the first power terminal VGH to be conducted with the pull-down reference node PD0 when the potential of the first clock signal is the first potential. In this case, the first power terminal VGH may transmit the first power signal at the first potential to the pull-down reference node PD0. In addition, the first denoising control sub-circuit 0211 may control the first power terminal VGH to be non-conducted with the pull-down reference node PD0 when the potential of the first clock signal is the second potential.

The second denoising control sub-circuit 0212 may be coupled to the shift node GO, the first power terminal VGH, the second power terminal VGL, the pull-down reference node PD0, and a first pull-down node PD1. The second denoising control sub-circuit 0212 may be configured to control the second power terminal VGL to be conducted with or non-conducted with the first pull-down node PD1 in response to the potential of the shift node GO, control the pull-down reference node PD0 to be conducted with or non-conducted with the first pull-down node PD1 in response to the potential of the pull-down reference node PD0, and control a potential of the first pull-down node PD1 based on the first power signal.

For example, the second denoising control sub-circuit 0212 may control the second power terminal VGL to be conducted with the pull-down reference node PD0 when the potential of the shift node GO is the first potential. In this case, the second power terminal VGL may transmit the second power signal at the second potential to the pull-down reference node PD0. In addition, the second denoising control sub-circuit 0212 may control the second power terminal VGL to be non-conducted with the pull-down reference node PD0 when the potential of the shift node GO is the second potential.

Moreover, the second denoising control sub-circuit 0212 may control the pull-down reference node PD0 to be conducted with the first pull-down node PD1 when the potential of the pull-down reference node PD0 is the first potential. In this case, the potential of the pull-down reference node PD0 can be transmitted to the first pull-down node PD1. In addition, the second denoising control sub-circuit 0212 may control the pull-down reference node PD0 to be non-conducted with the first pull-down node PD1 when the potential of the pull-down reference node PD0 is the second potential.

The denoising sub-circuit 0213 may be coupled to the first pull-down node PD1, the first power terminal VGH, and the output terminal Eout. The denoising sub-circuit 0213 may be configured to control the first power terminal VGH to be conducted with or non-conducted with the shift node GO in response to the potential of the first pull-down node PD1.

For example, the denoising sub-circuit 0213 may control the first power terminal VGH to be conducted with the shift node GO when the potential of the first pull-down node PD1 is the first potential. In this case, the first power terminal VGH may transmit the first power signal at the first potential to the shift node GO.

Moreover, the denoising sub-circuit 0213 may control the first power terminal VGH to be non-conducted with the shift node GO when the potential of the first pull-down node PD1 is the second potential.

Figure 5:
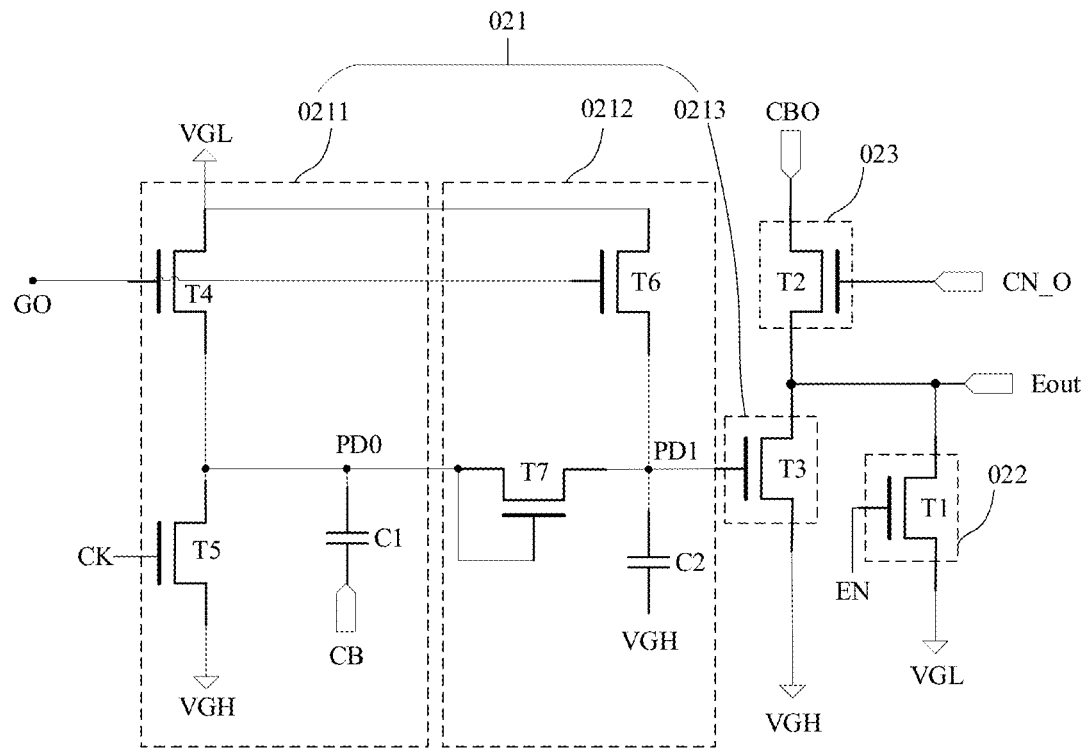
FIG. 5 is a schematic structural diagram of still another second shift circuit according to an embodiment of the present disclosure.

FIG. 5 is a schematic structural diagram of still another second shift circuit according to an embodiment of the present disclosure. As shown in FIG. 5, in the second shift circuit 02, the second output control sub-circuit 022 may include a first transistor T1, and the first output sub-circuit 023 may include a second transistor T2. In the first output control sub-circuit 021, the denoising sub-circuit 0213 may include a third transistor T3; the first denoising control sub-circuit 0211 may include a fourth transistor T4, a fifth transistor T5, and a first capacitor C1; and the second denoising control sub-circuit 0212 may include a sixth transistor T6, a seventh transistor T7, and a second capacitor C2.

A gate of the first transistor T1 may be coupled to the enable control terminal EN, a first electrode of the first transistor T1 may be coupled to the second power terminal VGL, and a second electrode of the first transistor T1 may be coupled to the output terminal Eout.

A gate of the second transistor T2 may be coupled to the output control terminal CN_O, a first electrode of the second transistor T2 may be coupled to the third clock terminal CBO, and a second electrode of the second transistor T2 may be coupled to the output terminal Eout.

A gate of the third transistor T3 may be coupled to the first pull-down node PD1, a first electrode of the third transistor T3 may be coupled to the first power terminal VGH, and a second electrode of the third transistor T3 may be coupled to the output terminal Eout.

A gate of the fourth transistor T4 and a gate of the sixth transistor T6 may both be coupled to the shift node GO, a first electrode of the fourth transistor T4 and a first electrode of the sixth transistor T6 may both be coupled to the second power terminal VGL, a second electrode of the fourth transistor T4 may be coupled to the pull-down reference node PD0, and a second electrode of the sixth transistor T6 may be coupled to the first pull-down node PD1.

A gate of the fifth transistor T5 may be coupled to the first clock terminal CK, a first electrode of the fifth transistor T5 may be coupled to the first power terminal VGH, and a second electrode of the fifth transistor T5 may be coupled to the pull-down reference node PD0.

A gate and a first electrode of the seventh transistor 17 may both be coupled to the pull-down reference node PD0, and a second electrode of the seventh transistor T7 may be coupled to the first pull-down node PD1.

One end of the first capacitor C1 may be coupled to the pull-down reference node PD0 and the other end of the first capacitor C1 may be coupled to the second clock terminal CB.

One end of the second capacitor C2 may be coupled to the first pull-down node PD1 and the other end of the second capacitor C2 may be coupled to the first power terminal VGH.

Optionally, the second transistor T2 and/or the third transistor T3 may be single-gate transistors, and the other transistors in the shift register unit may all be dual-gate transistors.

It is known from testing that if the second transistor T2 is a dual-gate transistor, the capacitance between the gate and the drain of the second transistor T2 is large. Accordingly, the second transistor 12 is slowly and insufficiently turned on. Consequently, the third clock signal at the first potential cannot be quickly and completely transmitted to the output terminal Eout once, and a step phenomenon occurs in the first potential of the output terminal Eout. Therefore, by setting the second transistor T2 as a single-gate transistor, the capacitance between the gate and the drain of the second transistor 12 can be effectively reduced. Accordingly, the second transistor T2 can be quickly and sufficiently turned on at the appropriate time to prevent the step phenomenon from occurring in the first potential of the third clock signal transmitted to the output terminal Eout through the second transistor T2. In this way, the problem of poor output of the output terminal Eout is improved. It has the same beneficial effect by setting the third transistor T3 as a single-gate transistor, and details are not described herein again.

Optionally, in the embodiments of the present disclosure, the output terminal Eout of the shift register unit may be coupled to a light-emission control line. The light-emission control line is generally coupled to the pixel circuit. In a light-emitting phase when the pixel circuit drives a light-emitting element coupled thereto to emit light, the light-emission control line needs to provide a light-emission control signal at the first potential such that the pixel circuit can reliably transmit a drive current to the light-emitting element to drive the light-emitting element to emit the light. In phases other than the light-emitting phase, the light-emission control line needs to provide a light-emission control signal at the second potential. That is, in the light-emitting phase, the output terminal Eout of the shift register unit needs to transmit the signal at the first potential to the light-emission control line; and in phases other than the light-emitting phase, the output terminal Eout of the shift register unit needs to transmit the signal at the second potential to the light-emission control line.

Based on this, it can be known that by setting the second shift circuit 02 to further include the second output control sub-circuit 022 (i.e., the first transistor T1), and setting the second output control sub-circuit 022 to directly transmit the second power signal at the second potential to the output terminal Eout in response to the enable control signal, on the basis of flexibly setting the potential of the enable control signal, it can be reliably ensured that the output terminal Eout can continuously transmit the signal at the second potential to the light-emission control line in phases other than the light-emitting phase. That is, it is ensured that the potential of the output terminal Eout maintains a stable low level.

Figure 6:
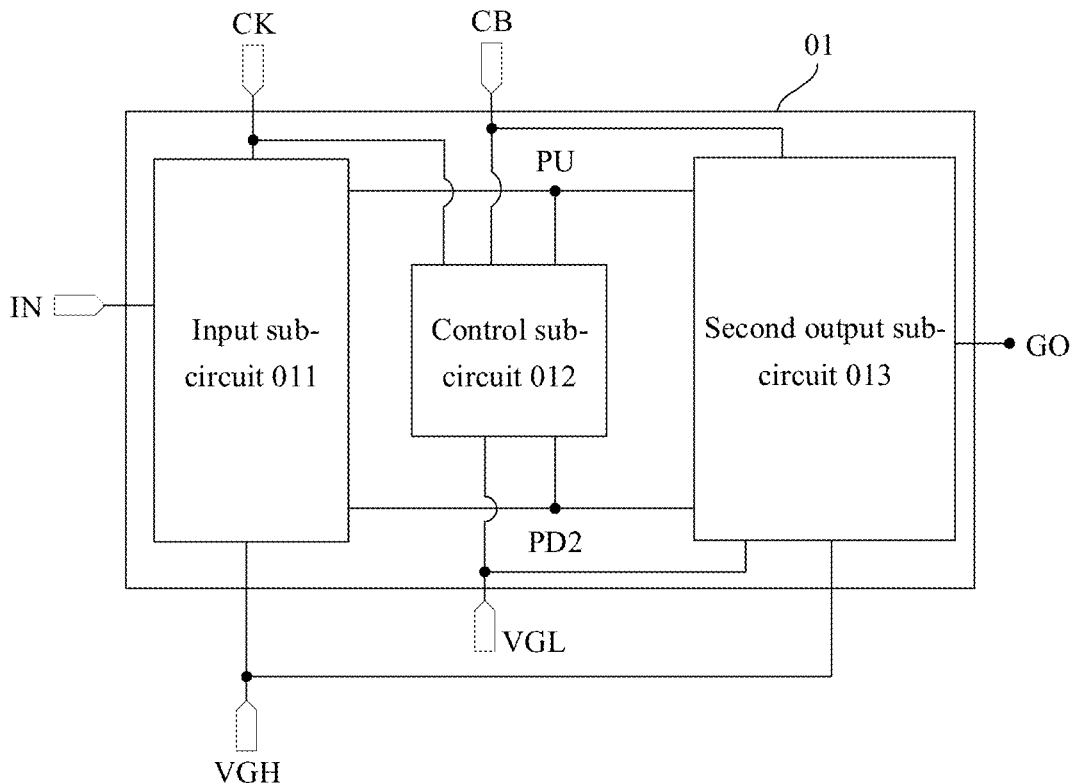
FIG. 6 is a schematic structural diagram of a first shift circuit according to an embodiment of the present disclosure.

FIG. 6 is a schematic structural diagram of a first shift circuit according to an embodiment of the present disclosure. As shown in FIG. 6, the first shift circuit 01 may include an input sub-circuit 011, a control sub-circuit 012, and a second output sub-circuit 013.

The input sub-circuit 011 may be coupled to the first clock terminal CK, the first power terminal VGH, the input signal terminal IN, a pull-up node PU, and a second pull-down node PD2. The input sub-circuit 011 may be configured to control the first power terminal VGH to be conducted with or non-conducted with the pull-up node PU and control the input signal terminal IN to be conducted with or non-conducted with the second pull-down node PD2 in response to the first clock signal.

For example, the input sub-circuit 011 may control the first power terminal VGH to be conducted with the pull-up node PU and control the input signal terminal IN to be conducted with the second pull-down node PD2 when the potential of the first clock signal is the first potential. In this case, the first power terminal VGH may transmit the first power signal at the first potential to the pull-up node PU, and the input signal terminal IN may transmit the input signal to the second pull-down node PD2.

Moreover, the input sub-circuit 011 may control the first power terminal VGH to be non-conducted with the pull-up node PU and control the input signal terminal IN to be non-conducted with the second pull-down node PD2 when the potential of the first clock signal is the second potential.

The control sub-circuit 012 may be coupled to the pull-up node PU, the second pull-down node PD2, the first clock terminal CK, the second clock terminal CB, and the second power terminal VGL. The control sub-circuit 012 may be configured to control the second power terminal VGL to be conducted with or non-conducted with the second pull-down node PD2 in response to a potential of the pull-up node PU and the second clock signal, and control the first clock terminal CK to be conducted with or non-conducted with the pull-up node PU in response to a potential of the second pull-down node PD2.

For example, the control sub-circuit 012 may control the second power terminal VGL to be conducted with the second pull-down node PD2 when the potential of the pull-up node PU and the potential of the second clock signal are both the first potential. In this case, the second power terminal VGL may transmit the second power signal at the second potential to the second pull-down node PD2. Moreover, the control sub-circuit 012 may control the second power terminal VGL to be non-conducted with the second pull-down node PD2 when the potential of the pull-up node PU and/or the potential of the second clock signal are the second potential.

The control sub-circuit 012 may control the first clock terminal CK to be conducted with the pull-up node PU when the potential of the second pull-down node PD2 is the first potential. In this case, the first clock terminal CK may transmit the first clock signal to the pull-up node PU. Moreover, the control sub-circuit 012 may control the first clock terminal CK to be non-conducted with the pull-up node PU when the potential of the second pull-down node PD2 is the second potential.

The second output sub-circuit 013 may be coupled to the pull-up node PU, the second pull-down node PD2, the first power terminal VGH, the second power terminal VGL, the second clock terminal CB, and the shift node GO. The second output sub-circuit 013 may be configured to control the second power terminal VGL to be conducted with or non-conducted with the shift node GO in response to the potential of the pull-up node PU, and control the second clock terminal CB to be conducted with or non-conducted with the shift node GO in response to the potential of the second pull-down node PD2 and the first power signal.

For example, the second output sub-circuit 013 may control the second power terminal VGL to be conducted with the shift node GO when the potential of the pull-up node PU is the first potential. In this case, the second power terminal VGL may transmit the second power signal at the second potential to the shift node GO. Moreover, the second output sub-circuit 013 may control the second power terminal VGL to be non-conducted with the shift node GO when the potential of the pull-up node PU is the second potential.

The second output sub-circuit 013 may control the second clock terminal CB to be conducted with the shift node GO in response to the potential of the second pull-down node PD2 and the first power signal at the first potential when the potential of the second pull-down node PD2 is the first potential. In this case, the second clock terminal CB may transmit the second clock signal to the shift node GO. Moreover, the second output sub-circuit 013 may control the second clock terminal CB to be non-conducted with the shift node GO in response to the potential of the second pull-down node PD2 and the first power signal at the first potential when the potential of the second pull-down node PD2 is the second potential.

Figure 7:
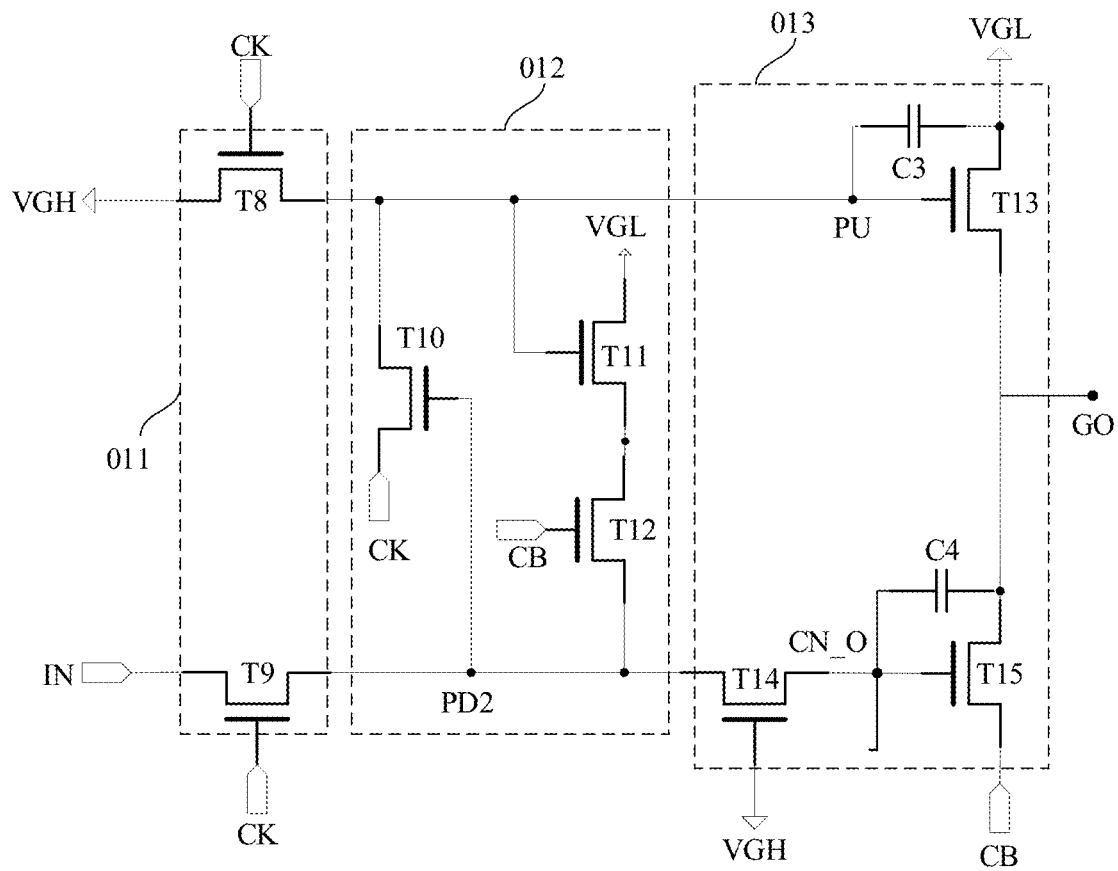
FIG. 7 is a schematic structural diagram of another first shift circuit according to an embodiment of the present disclosure.

FIG. 7 is a schematic structural diagram of another first shift circuit according to an embodiment of the present disclosure. As shown in FIG. 7, in the first shift circuit 01, the input sub-circuit 011 may include an eighth transistor T8 and a ninth transistor T9; the control sub-circuit 012 may include a tenth transistor T10, an eleventh transistor T11, and a twelfth transistor T12; and the second output sub-circuit 013 may include a thirteenth transistor T13, a fourteenth transistor T14, a fifteenth transistor T15, a third capacitor C3, and a fourth capacitor C4.

A gate of the eighth transistor T8 and a gate of ninth transistor T9 may be both coupled to the first clock terminal CK, a first electrode of the eighth transistor T8 may be coupled to the first power terminal VGH, and a second electrode of the eighth transistor T8 may be coupled to the pull-up node PU. A first electrode of the ninth transistor T9 may be coupled to the input signal terminal IN, and a second electrode of the ninth transistor T9 may be coupled to the second pull-down node PD2.

A gate of the tenth transistor T10 may be coupled to the second pull-down node PD2, a first electrode of the tenth transistor T10 may be coupled to the first clock terminal CK, and a second electrode of the tenth transistor T10 may be coupled to the pull-up node PU.

A gate of the eleventh transistor T11 may be coupled to the pull-up node PU, a first electrode of the eleventh transistor T11 may be coupled to the second power terminal VGL, and a second electrode of the eleventh transistor T11 may be coupled to a first electrode of the twelfth transistor T12. A gate of the twelfth transistor T12 may be coupled to the second clock terminal CB and a second electrode of the twelfth transistor T12 may be coupled to the second pull-down node PD2.

A gate of the thirteenth transistor T13 may be coupled to the pull-up node PU, a first electrode of the thirteenth transistor T13 may be coupled to the second power terminal VGL, and a second electrode of the thirteenth transistor T13 may be coupled to the shift node GO.

A gate of the fourteenth transistor T14 may be coupled to the first power terminal VGH, a first electrode of the fourteenth transistor T14 may be coupled to the second pull-down node PD2, and a second electrode of the fourteenth transistor T14 may be coupled to a gate of the fifteenth transistor T15. A first electrode of the fifteenth transistor T15 may be coupled to the second clock terminal CB and a second electrode of the fifteenth transistor T15 may be coupled to the shift node GO.

One end of the third capacitor C3 may be coupled to the pull-up node PU and the other end of the third capacitor C3 may be coupled to the second power terminal VGL.

One end of the fourth capacitor C4 may be coupled to the gate of the fifteenth transistor T15 and the other end of the fourth capacitor C4 may be coupled to the shift node GO.

Figure 8:
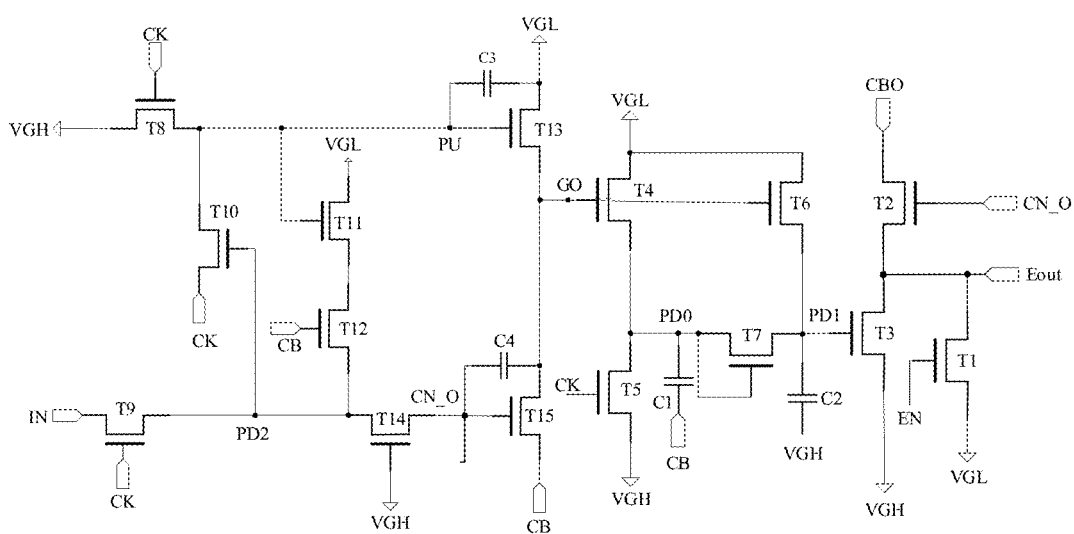
FIG. 8 is a schematic structural diagram of another shift register unit according to an embodiment of the present disclosure.

Optionally, in combination with FIG. 5 and FIG. 7, FIG. 8 is a schematic structural diagram of another shift register unit according to an embodiment of the present disclosure. Referring to FIG. 8, the output control terminal CN_O coupled to the first output sub-circuit 023 (i.e., the second transistor T2) may be coupled to the gate of the fifteenth transistor T15. That is, the potential of the output control signal provided by the output control terminal CN_O may be the same as the potential at the gate of the fifteenth transistor T15. In this way, the number of signal terminals that need to be set can be reduced, thereby reducing costs.

Optionally, the transistors in the shift register unit in the embodiments of the present disclosure may all be N-type transistors. Certainly, in some embodiments, the transistors may also be P-type transistors. In the case that the transistors are P-type transistors, the first potential may be a low potential relative to the second potential.

Figure 9:
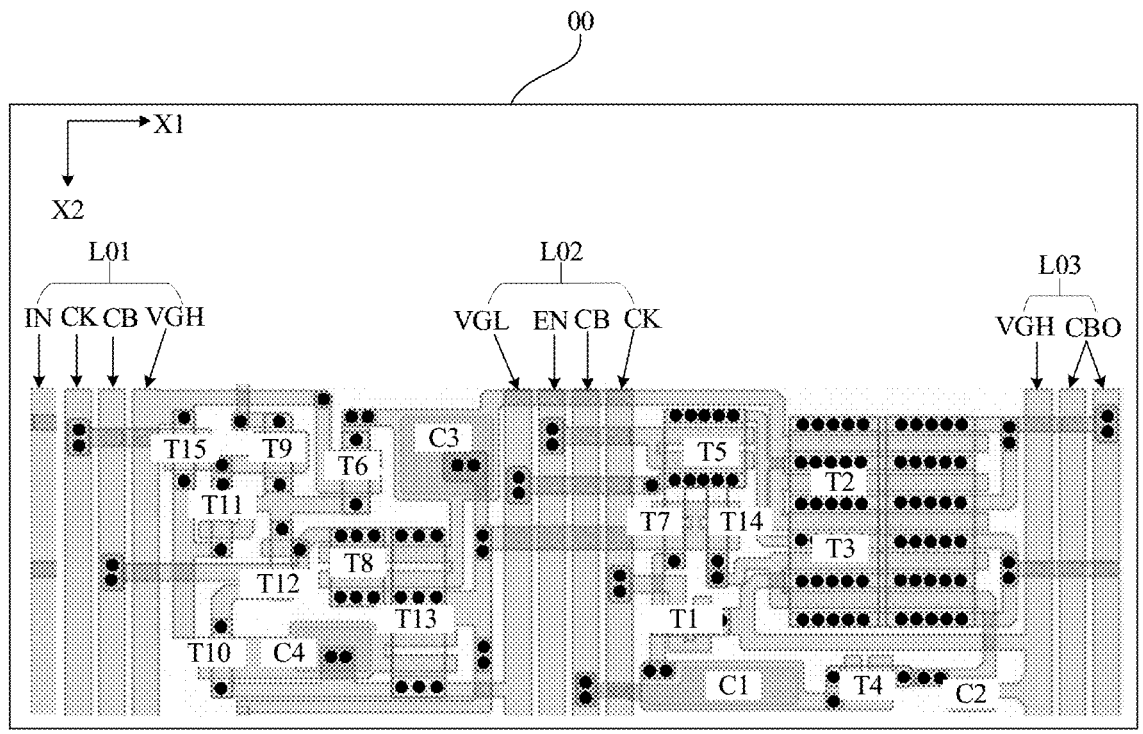
FIG. 9 is a diagram of a structural layout of a shift register unit according to an embodiment of the present disclosure.

Optionally, by taking the structure shown in FIG. 8 and the second transistor 12 being a single-gate transistor as an example, FIG. 9 shows a structural layout of a shift register unit, and FIG. 10 to FIG. 14 show layouts of different layers in the structural layout shown in FIG. 9. Referring to FIG. 9 to FIG. 14, the shift register unit may include a semiconductor layer, a first conductive layer, a second conductive layer, and a third conductive layer which are disposed on a side of the substrate.

The semiconductor layer at least includes a channel region, a source region, and a drain region of at least one transistor in the shift register unit. For example, referring to FIG. 10, the semiconductor layer at least includes a channel region a11, a source region a21, and a drain region a31 of the first transistor T1; a channel region a12, a source region a22, and a drain region a32 of the second transistor T2; a channel region a13, a source region a23, and a drain region a33 of the third transistor T3; a channel region a14, a source region a24, and a drain region a34 of the fourth transistor T4; a channel region a15, a source region a25, and a drain region a35 of the fifth transistor T5; a channel region a16, a source region a26, and a drain region a36 of the sixth transistor T6; a channel region a17, a source region a27, and a drain region a37 of the seventh transistor T7; a channel region a18, a source region a28, and a drain region a38 of the eighth transistor T8; a channel region a19, a source region a29, and a drain region a39 of the ninth transistor T9; a channel region a110, a source region a210, and a drain region a310 of the tenth transistor T10; a channel region a111, a source region a211, and a drain region a311 of the eleventh transistor T11; a channel region a112, a source region a212, and a drain region a312 of the twelve transistor T12; a channel region a113, a source region a213, and a drain region a313 of the thirteenth transistor T13; a channel region a114, a source region a214, and a drain region a314 of the fourteenth transistor T14; and a channel region a115, a source region a215, and a drain region a315 of the fifteenth transistor T15.

The first conductive layer may at least include the gate of at least one transistor and a first capacitive electrode of at least one capacitor in the shift register unit. The gate and the channel region of at least one transistor are overlapped.

Figure 10:
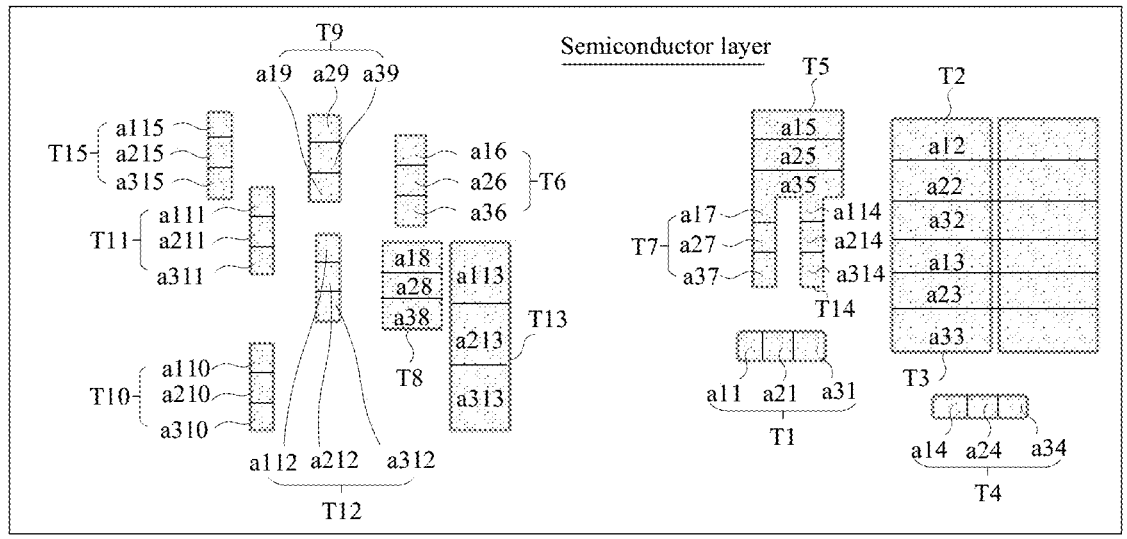
FIG. 10 is a diagram of a structural layout of an active layer in a shift register unit according to an embodiment of the present disclosure.
Figure 11:
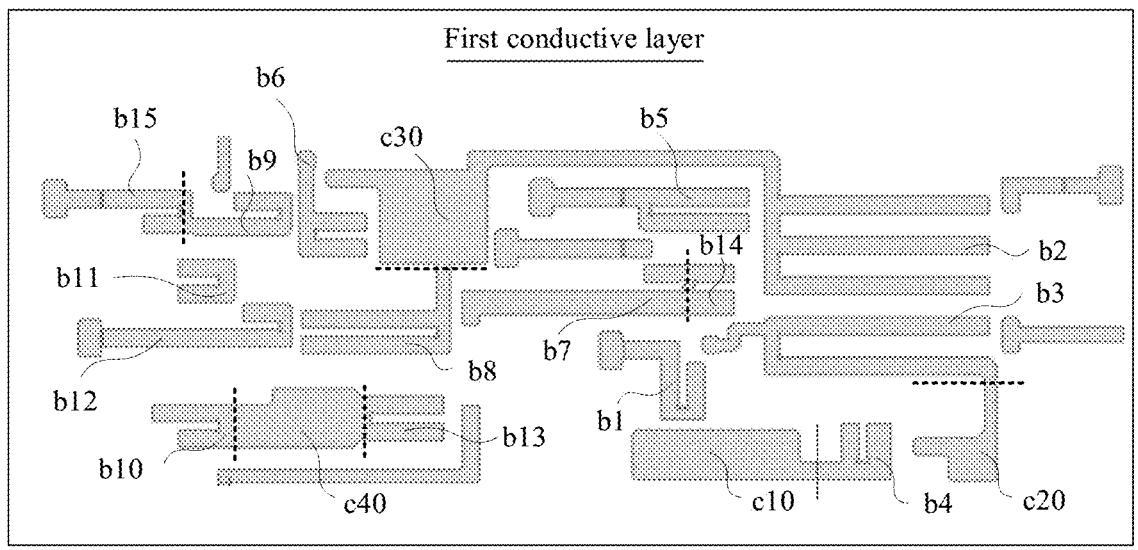
FIG. 11 is a diagram of a structural layout of a first conductive layer in a shift register unit according to an embodiment of the present disclosure.

For example, referring to FIG. 11, the first conductive layer at least includes the gate b1 of the first transistor T1, the gate b2 of the second transistor T2, the gate b3 of the third transistor T3, and the gate b4 of the fourth transistor T4, the gate b5 of the fifth transistor T5, the gate b6 of the sixth transistor T6, the gate b7 of the seventh transistor T7, the gate b8 of the eighth transistor T8, the gate b9 of the ninth transistor T9, the gate b10 of the tenth transistor T10, the gate b11 of the eleventh transistor T11, the gate b12 of the twelfth transistor T12, the gate b13 of the thirteenth transistor T13, the gate b14 of the fourteenth transistor T14, the gate b15 of the fifteenth transistor T15, a first capacitive electrode c0 of the first capacitor C1, a first capacitive electrode c20 of the second capacitor C2, a first capacitive electrode c30 of the third capacitor C3, and a first capacitive electrode c40 of the fourth capacitor C4. Referring to FIG. 9 and FIG. 10, the gate and the channel region of each transistor are overlapped.

The second conductive layer may at least include a second capacitive electrode of at least one capacitor in the shift register unit. The second capacitive electrode and the first capacitive electrode of the at least one capacitor are overlapped.

Figure 12:
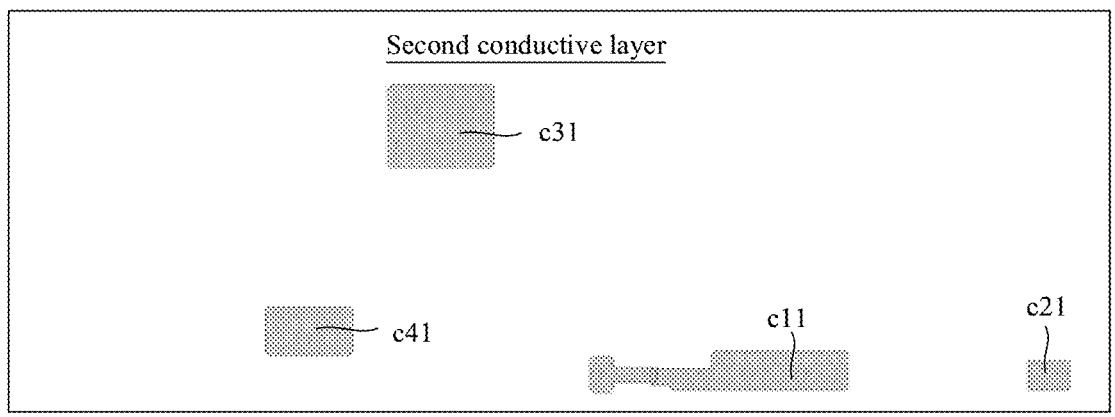
FIG. 12 is a diagram of a structural layout of a second conductive layer in a shift register unit according to an embodiment of the present disclosure.

For example, referring to FIG. 12, the second conductive layer at least includes a second capacitive electrode c11 of the first capacitor C1, a second capacitive electrode c21 of the second capacitor C2, a second capacitive electrode c31 of the third capacitor C3, and a second capacitive electrode c41 of the fourth capacitor C4. In combination with FIG. 9 and FIG. 11, it can be known that the first capacitive electrode and the second capacitive electrode of each capacitor are overlapped. For example, the first capacitive electrode c0 and the second capacitive electrode c11 of the first capacitor C1 are overlapped.

The third conductive layer may at least include a plurality of signal lines, and the source and the drain of at least one transistor in the shift register unit. The source and the source region of the at least one transistor are coupled, and the drain and the drain region of the at least one transistor are coupled. The plurality of signal lines are respectively coupled to the signal terminals coupled to the shift register unit.

Figure 13:
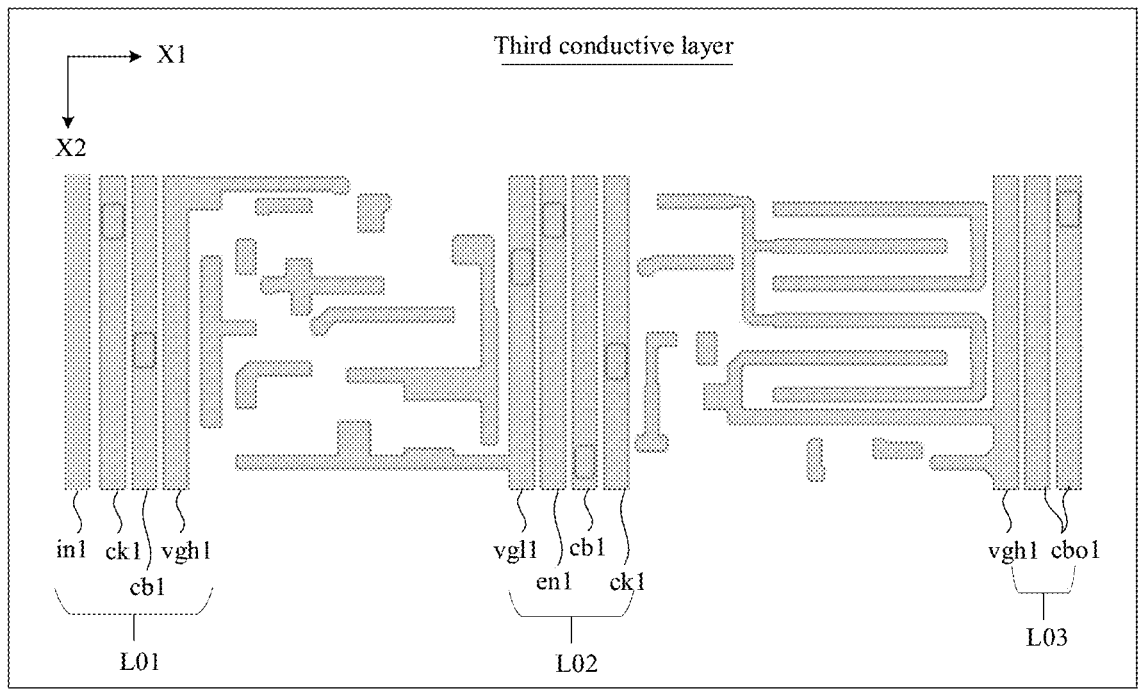
FIG. 13 is a diagram of a structural layout of a third conductive layer in a shift register unit according to an embodiment of the present disclosure.

For example, referring to FIG. 13, the third conductive layer includes a first power line vgh1, an input signal line in1, a first clock signal line ck1, a second clock signal line cb1, an enable control line en1, a second power line vgl1, a third clock signal line cbo1, and the source and drain (not marked in FIG. 13) of each of the first transistor T1 to the fourteenth transistor T14. In combination with FIG. 9 and FIG. 10, it can be known that for each transistor, the source is coupled to the source region, and the drain is coupled to the drain region. In addition, the plurality of signal lines are respectively coupled to the signal terminals coupled to the shift register unit. For example, the first power line vgh1 is coupled to the first power terminal VGH, the input signal line in1 is coupled to the input signal terminal IN, the first clock signal line ck1 is coupled to the first clock terminal CK, the second clock signal line cb1 is coupled to the second clock terminal CB, the enable control line en1 is coupled to the enable control terminal EN, the second power line vgl1 is coupled to the second power terminal VGL, and the third clock signal line cbo1 is coupled to the third clock terminal CBO.

Figure 14:
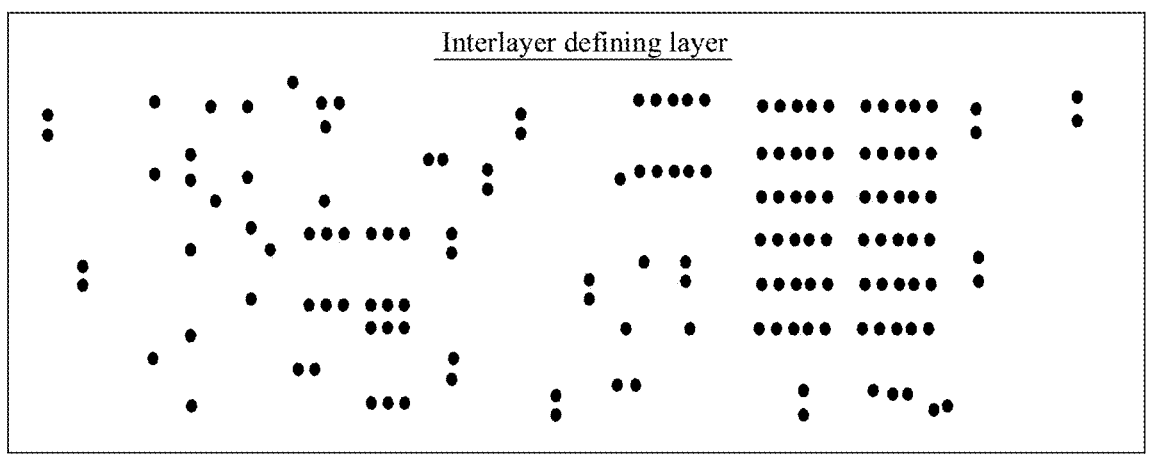
FIG. 14 is a diagram of a structural layout of an interlayer defining layer in a shift register unit according to an embodiment of the present disclosure.

In addition, referring to FIG. 9 and FIG. 14, it can be further known that the shift register unit in the embodiments of the present disclosure further includes an interlayer defining layer configured to be provided with a via hole therein. The via hole is configured to expose the conductive layers that are sequentially laminated and need to be coupled, such that the conductive layers are coupled to each other.

With reference to the structures shown in FIG. 9 and FIG. 13, the plurality of signal lines provided in the embodiments of the present disclosure may include a first group of signal lines L01, a second group of signal lines L02, and a third group of signal lines L03 that are sequentially spaced in a first direction X1.

The first group of signal lines L01 may include the first power line vgh1 coupled to the first power terminal VGH, the input signal line in1 coupled to the input signal terminal IN, the first clock signal line ck1 coupled to the first clock terminal CK, and the second clock signal line cb1 coupled to the second clock terminal CB. The second group of signal lines L02 may include the enable control line en1 coupled to the enable control terminal EN, the second power line vgl1 coupled to the second power terminal VGL, the first clock signal line ck1, and the second clock signal line cb1. The third group of signal lines L03 may include the first power line vgh1, and the third clock signal line cbo1 coupled to the third clock terminal CBO.

Optionally, referring to FIG. 9 and FIG. 13, the first group of signal lines L01, a first group of transistors in the shift register unit 00, a first group of capacitors in the shift register unit 00, the second group of signal lines L02, a second group of transistors in the shift register unit 00, a second group of capacitors in the shift register unit 00, and the third group of signal lines L03 may be sequentially arranged in the first direction X1. At least one of the plurality of signal lines extends in a second direction X2. In addition, in the first direction X1, the input signal line in1, the first clock signal line ck1, the second clock signal line cb1, and the first power line vgh1 in the first group of signal lines L01 are sequentially arranged; the second power line vgl1, the enable control line en1, the second clock signal line cb1, and the first clock signal line ck1 in the second group of signal lines L02 are sequentially arranged; and the first power line vgh1 and the third clock signal line cbo1 in the third group of signal lines L03 are sequentially arranged. The first direction X1 is a direction from the non-display region B0 to the display region A0, and the second direction X2 intersects the first direction X1. For example, referring to FIG. 9 and FIG. 13, the first direction X1 is perpendicular to the second direction X2.

Optionally, referring to FIG. 9, the first group of transistors may include the sixth transistor T6, the eighth transistor T8, the ninth transistor T9, the tenth transistor T10, and the eleventh transistor T11, the twelfth transistor T12, the thirteenth transistor T13, and the fifteenth transistor T15 in the shift register unit 00. The first group of capacitors may include the third capacitor C3 and the fourth capacitor C4 in the shift register unit 00. The second group of transistors may include the first transistor T1, the second transistor T2, the third transistor T3, the fourth transistor T4, the fifth transistor T5, the seventh transistor T7 and the fourteenth transistor T14 in the shift register unit 00. The second group of capacitors may include the first capacitor C1 and the second capacitor C2 in the shift register unit 00.

Optionally, referring to FIG. 9, the fourth capacitor C4 may be disposed between the tenth transistor T10 and the thirteenth transistor T13; and the tenth transistor T10, the fourth capacitor C4, and the thirteenth transistor T13 may be sequentially arranged in a direction close to the second group of signal lines L02. The fifteenth transistor T15, the ninth transistor T9, the sixth transistor T6, and the third capacitor C3 may be sequentially arranged in the direction close to the second group of signal lines L02. The eleventh transistor T11 may be disposed between the fifteenth transistor T15 and the tenth transistor T10, and is farther from the first group of signal lines L01 than the fifteenth transistor T15 is. The twelfth transistor T12 and the eighth transistor T8 may be disposed between the ninth transistor T9 and the fourth capacitor C4, sequentially arranged in the direction close to the second group of signal lines L02, and both closer to the tenth transistor T10 than the eleventh transistor T11 is.

Optionally, referring to FIG. 9, the fourth transistor T4 may be disposed between the first capacitor C1 and the second capacitor C2; and the first capacitor C1, the fourth transistor T4, and the second capacitor C2 may be sequentially arranged in a direction close to the third group of signal lines L03. The fifth transistor T5, the first transistor T1, and the first capacitor C1 may be sequentially arranged in the second direction X2. The seventh transistor T7 and the fourteenth transistor T14 may be disposed between the fifth transistor T5 and the first transistor T1, and sequentially arranged in the direction close to the third group of signal lines L03. The second transistor T2 and the third transistor T3 may be sequentially arranged in the second direction and disposed on the side, away from the second group of signal lines L02, of the fourteenth transistor T14. The second transistor T2 is farther from the fourth transistor T4 than the third transistor T3 is.

Optionally, referring to FIG. 9 and FIG. 10, the semiconductor layer of the fifth transistor T5, the semiconductor layer of the seventh transistor T7, and the semiconductor layer of the fourteenth transistor T14 may be of an integral structure; and the semiconductor layer of the second transistor T2 and the semiconductor layer of the third transistor T3 may be of an integral structure.

Optionally, referring to FIG. 9 and FIG. 11, the gate b15 of the fifteenth transistor T15 and the gate b9 of the ninth transistor T9 may be of an integral structure. The first capacitive electrode c30 of the third capacitor C3, the gate b8 of the eighth transistor T8, and the gate b2 of the second transistor T2 may be of an integral structure. The gate b7 of the seventh transistor T7 and the gate b14 of the fourteenth transistor T14 may be of an integral structure. The gate b3 of the third transistor T3 and the first capacitive electrode c20 of the second capacitor C2 may be of an integral structure. The gate b4 of the fourth transistor T4 and the first capacitive electrode c10 of the first capacitor C1 may be of an integral structure. The gate b10 of the tenth transistor T10 and the first capacitive electrode c40 of the fourth capacitor C4 may be of an integral structure. In the shift register unit 00 in the embodiments of the present disclosure, the orthographic projections of the gate b2 of the second transistor T2 and/or the gate b3 of the third transistor T3 on the substrate 10 may be strip-shaped and extend in the first direction X1. Furthermore, the orthographic projections of the gates of the transistors other than the transistors with strip-shaped gates on the substrate 10 may all be U-shaped, that is, have a dual-gate structure.

It should be noted that the integral structure may be formed through a one-time patterning process. The patterning process may include depositing a film layer, coating photoresist, mask exposure, developing, etching, and stripping the photoresist. Depositing may include any one or more of sputtering, evaporation, and chemical vapor deposition, coating may adopt any one or more of spray coating and spin coating, and etching may adopt any one or more of dry etching and wet etching. The film refers to a layer of film obtained by depositing or coating a material on the substrate. If a patterning process does not need to be performed on the film during the entire preparation process, the film may also be referred to as a layer. If a patterning process needs to be performed on the film during the entire preparation process, the film is referred to as the film before the patterning process and as a layer after the patterning process. The layer obtained through the patterning process includes at least one pattern.

In summary, the embodiments of the present disclosure provide the display panel. The shift register unit in the display panel includes the first shift circuit and the second shift circuit. The second shift circuit is coupled to the enable control terminal, the second power terminal, and the output terminal. The second shift circuit may control the second power terminal to be conducted with the output terminal under the control of the enable control terminal, that is, control the second power terminal to provide the second power signal to the output terminal. In this way, in comparison with the related art, the flexibility of controlling the potential of the output terminal by the shift register unit is improved.

Figure 15:
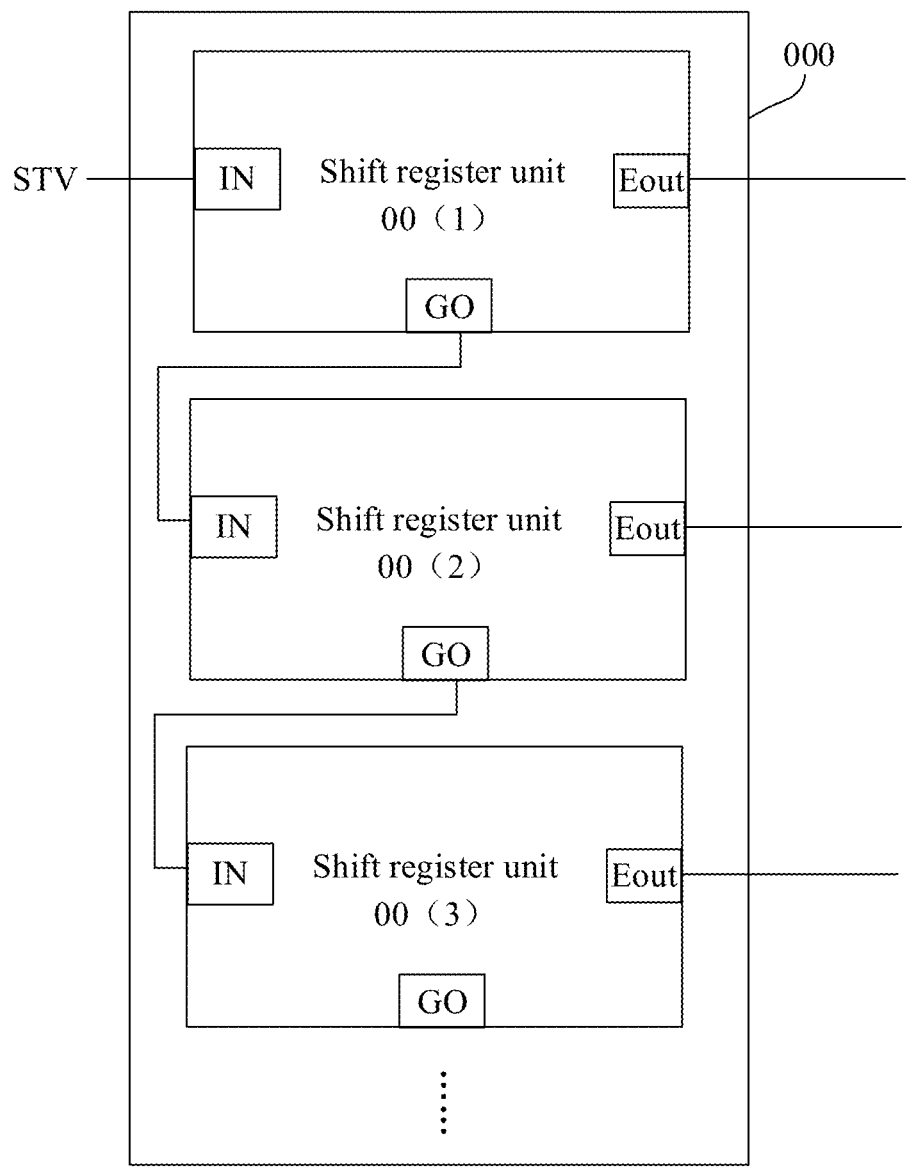
FIG. 15 is a schematic structural diagram of a shift register according to an embodiment of the present disclosure.

FIG. 15 is a schematic structural diagram of a shift register according to an embodiment of the present disclosure. As shown in FIG. 15, the shift register 000 includes at least two cascaded shift register units 00 shown in any one of FIG. 2, FIG. 8, and FIG. 9.

The shift node G0 of the shift register unit 00 at each stage may be coupled to an input signal terminal IN of the shift register unit 00 at a next stage and the output terminal Eout of the shift register unit 00 at each stage may be coupled to a target signal line (not shown in the figure).

The shift register unit 00 at each stage may transmit a drive signal to the coupled target signal line through its output terminal Eout. The target signal line may be coupled to the pixel circuit in the display panel. The pixel circuit may drive the coupled light-emitting element to emit light based on the signal provided by the target signal line. For example, as described in the foregoing embodiments, the target signal line may be the light-emission control line.

In addition, it can be learned with reference to the foregoing embodiments that the shift register unit 00 at each stage may further be coupled to the first clock terminal CK, the second clock terminal CB, the third clock terminal CBO, the first power terminal VGH, the second power terminal VGL, and the enable control terminal EN (not shown in FIG. 15). In addition, an input signal terminal IN of the shift register unit 00 at the first stage may be coupled to a frame start signal terminal STV shown in FIG. 15 to receive a frame start signal from the frame start signal terminal STV.

Figure 16:
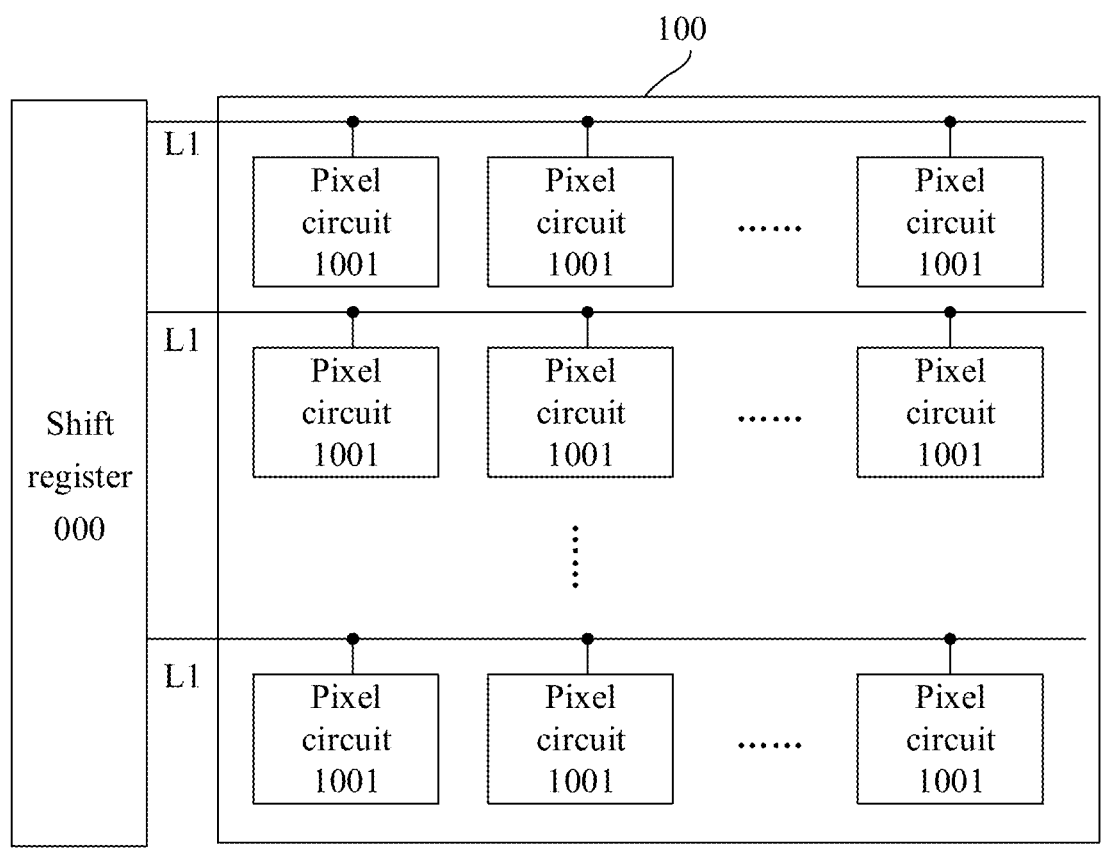
FIG. 16 is a schematic structural diagram of a display apparatus according to an embodiment of the present disclosure.

FIG. 16 is a schematic structural diagram of a display apparatus according to an embodiment of the present disclosure. As shown in FIG. 16, the display apparatus may include the display panel 100 described in the foregoing embodiments. The display panel 100 may further include a plurality of pixel circuits 1001 and a plurality of target signal lines L1. The plurality of pixel circuits 1001 in the same row are coupled to one of the plurality of target signal lines L1, and each pixel circuit 1001 is further coupled to one light-emitting element (not shown in the figure). The shift register 000 may be coupled to the plurality of target signal lines L1 and the shift register 000 may be configured to provide drive signals for the plurality of target signal lines L1. The pixel circuit 1001 may be configured to drive the coupled light-emitting element to emit light based on the drive signal.

Figure 17:
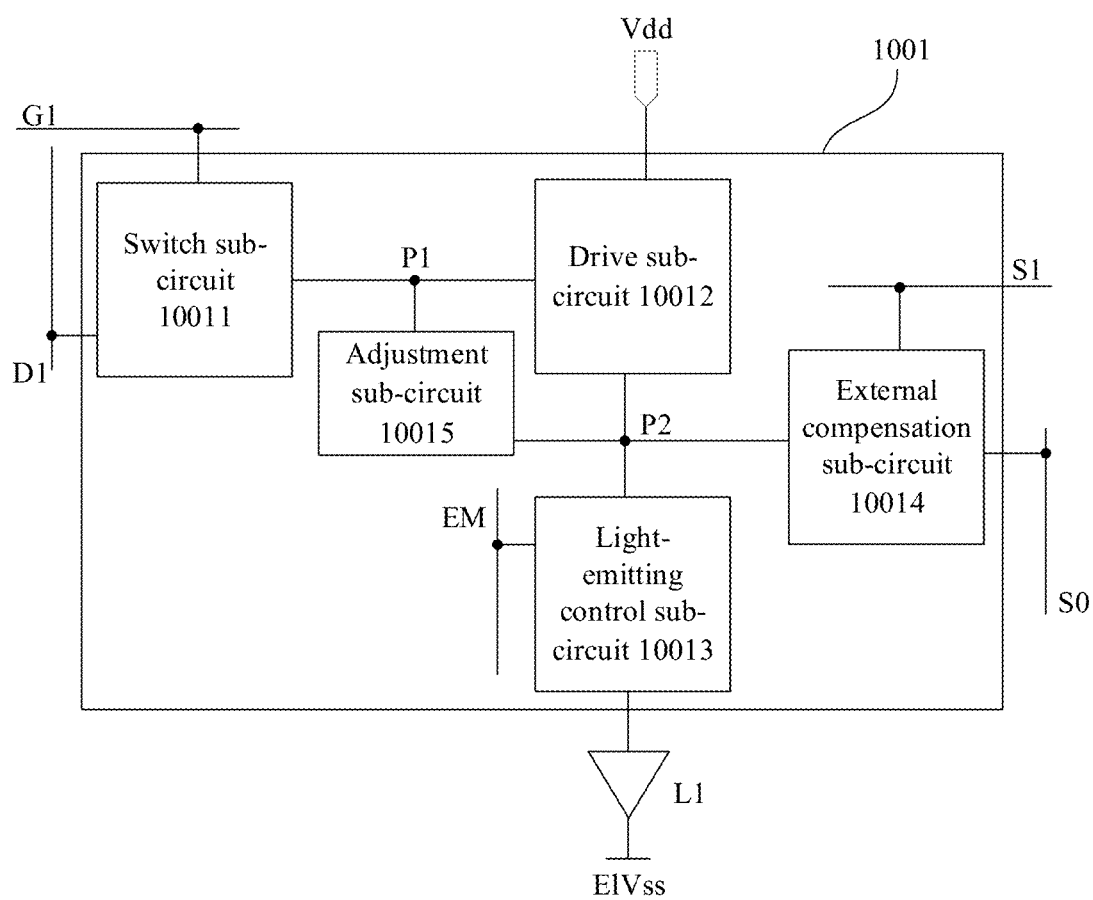
FIG. 17 is a schematic structural diagram of a pixel circuit according to an embodiment of the present disclosure.

FIG. 17 is a schematic structural diagram of a pixel circuit according to an embodiment of the present disclosure. As shown in FIG. 17, the pixel circuit 1001 may include a switch sub-circuit 10011, a drive sub-circuit 10012, a light-emitting control sub-circuit 10013, an external compensation sub-circuit 10014, and an adjustment sub-circuit 10015.

The switch sub-circuit 10011 may be coupled to the gate line G1, a data line D1, and a first node P1. The switch sub-circuit 10011 may be configured to control the data line D1 to be conducted with or non-conducted with the first node P1 in response to a gate drive signal from the gate line G1.

For example, the switch sub-circuit 10011 may control the data line D1 to be conducted with the first node P1 when a potential of the gate drive signal is the first potential. In this case, the data line D1 may transmit a data signal to the first node P1. In addition, the switch sub-circuit 10011 may control the data line D1 to be non-conducted with the first node P1 when the potential of the gate drive signal is the second potential.

The drive sub-circuit 10012 may be coupled to the first node P1, a drive power terminal Vdd, and a second node P2. The drive sub-circuit 10012 may be configured to transmit a drive signal to the second node P2 based on a potential of the first node P1 and a drive power signal provided by the drive power terminal Vdd.

For example, the drive sub-circuit 10012 may transmit a drive current to the second node P2 based on the potential of the first node P1 and the drive power signal.

The light-emitting control sub-circuit 10013 may be coupled to a light-emission control line EM, the second node P2, and a light-emitting element L0. The light-emitting control sub-circuit 10013 may be configured to control the second node P2 to be conducted with or non-conducted with the light-emitting element L0 in response to a light-emission control signal from the light-emission control line EM.

For example, the light-emitting control sub-circuit 10013 may be coupled to an anode of the light-emitting element L0, and a cathode of the light-emitting element L0 may be coupled to a pull-down power terminal ELVss. The light-emitting control sub-circuit 10013 may control the second node P2 to be conducted with the light-emitting element L0 when a potential of the light-emission control signal is the first potential. In this case, the drive current transmitted by the drive sub-circuit 10012 to the second node P2 may be transmitted to the light-emitting element L0 through the light-emitting control sub-circuit 10013 to drive the light-emitting element L0 to emit light. In addition, the light-emitting control sub-circuit 10013 may control the second node P2 to be non-conducted with the light-emitting element L0 when the potential of the light-emission control signal is the second potential.

The external compensation sub-circuit 10014 may be coupled to a scan signal line S1, the second node P2, and a detection signal line S0. The external compensation sub-circuit 10014 may be configured to control the second node P2 to be conducted with or non-conducted with the detection signal line S0 in response to a scan signal provided by the scan signal line S1.

For example, the external compensation sub-circuit 10014 may control the second node P2 to be conducted with the detection signal line S0 when a potential of the scan signal is the first potential. In this case, the detection signal line S0 may transmit a detection signal to the second node P2, and the detection signal line S0 may acquire the potential of the second node P2. In addition, the external compensation sub-circuit 10014 may control the second node P2 to be non-conducted with the detection signal line S0 when the potential of the scan signal is the second potential.

The adjustment sub-circuit 10015 may be coupled to the first node P1 and the second node P2. The adjustment sub-circuit 10015 may be configured to adjust the potential of the first node P1 and the potential of the second node P2.

For example, the adjustment sub-circuit 10015 may adjust the potential of the first node P1 and the potential of the second node P2 through bootstrapping.

Figure 18:
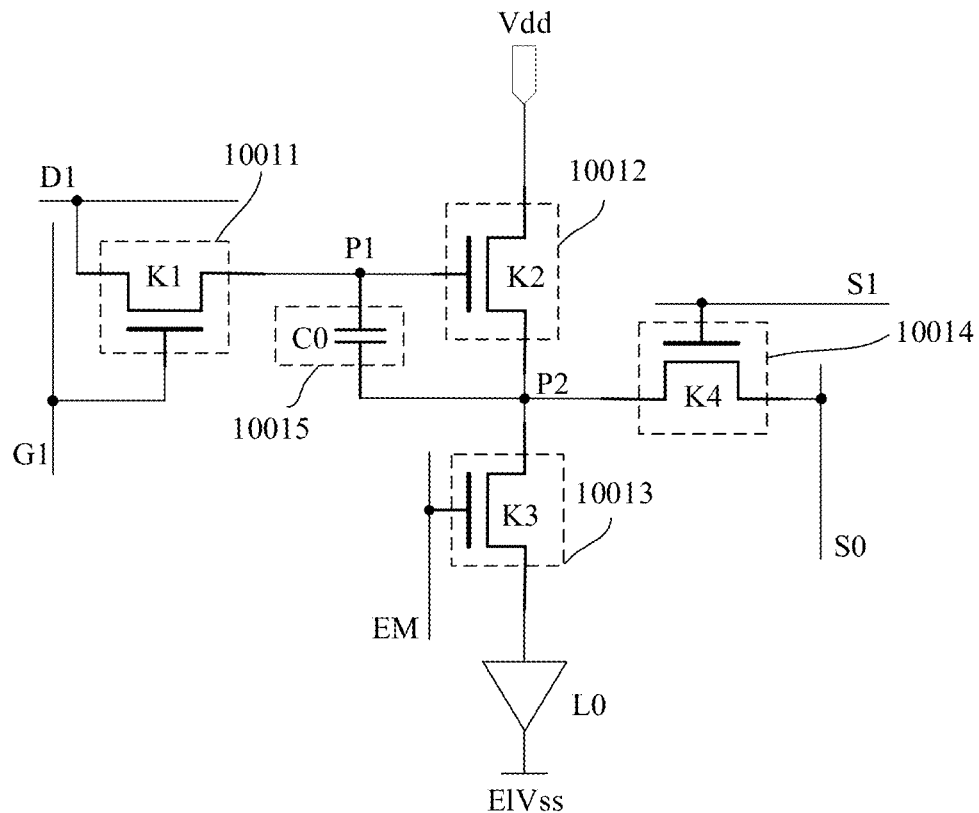
FIG. 18 is a schematic structural diagram of another pixel circuit according to an embodiment of the present disclosure.

FIG. 18 is a schematic structural diagram of another pixel circuit according to an embodiment of the present disclosure. As shown in FIG. 18, the switch sub-circuit 10011 may include a switch transistor K1; the drive sub-circuit 10012 may include a drive transistor K2; the light-emitting control sub-circuit 10013 may include a light-emission control transistor K3; the external compensation sub-circuit 10014 may include a compensation transistor K4; and the adjustment sub-circuit 10015 may include a storage capacitor C0.

A gate of the switch transistor K1 may be coupled to the gate line G1, a first electrode of the switch transistor K1 may be coupled to the data line, and a second electrode of the switch transistor K1 may be coupled to the first node P1.

A gate of the drive transistor K2 may be coupled to the drive power terminal Vdd, a first electrode of the drive transistor K2 may be coupled to the first node P1, and a second electrode of the drive transistor K2 may be coupled to the second node P2.

A gate of the light-emission control transistor K3 may be coupled to the light-emission control line EM, a first electrode of the light-emission control transistor K3 may be coupled to the second node P2, and a second electrode of the light-emission control transistor K3 may be coupled to the light-emitting element L0.

A gate of the compensation transistor K4 may be coupled to the scan signal line S1, a first electrode of the compensation transistor K4 may be coupled to the second node P2, and a second electrode of the compensation transistor K4 may be coupled to the detection signal line S0.

One end of the storage capacitor C0 may be coupled to the first node P1 and the other end of the storage capacitor C0 may be coupled to the second node P2.

It can be learned with reference to FIG. 17, FIG. 18, and the foregoing embodiments that the target signal line coupled to the shift register 000 in the embodiments of the present disclosure may be the light-emission control line EM. That is, the output terminal Eout of the shift register unit 00 at each stage in the shift register 000 may be coupled to the light-emission control line EM to provide the required light-emission control signal to the light-emission control line EM.

Optionally, in the embodiments of the present disclosure, the detection signal line S0 coupled to the compensation transistor K4 may further be coupled to an external compensation circuit, and the data line D1 may further be coupled to a source drive circuit. The external compensation circuit may determine a threshold voltage of the drive transistor K2 based on the potential of the second node P2 acquired by the detection signal line S0, and transmit the threshold voltage to the source drive circuit. The source drive circuit may flexibly adjust the required data signal provided to the coupled data line D1 based on the received threshold voltage, to prevent the drift of the threshold voltage from adversely affecting a light-emitting effect of the light-emitting element L0. This process may also be referred to as external compensation.

Figure 19:
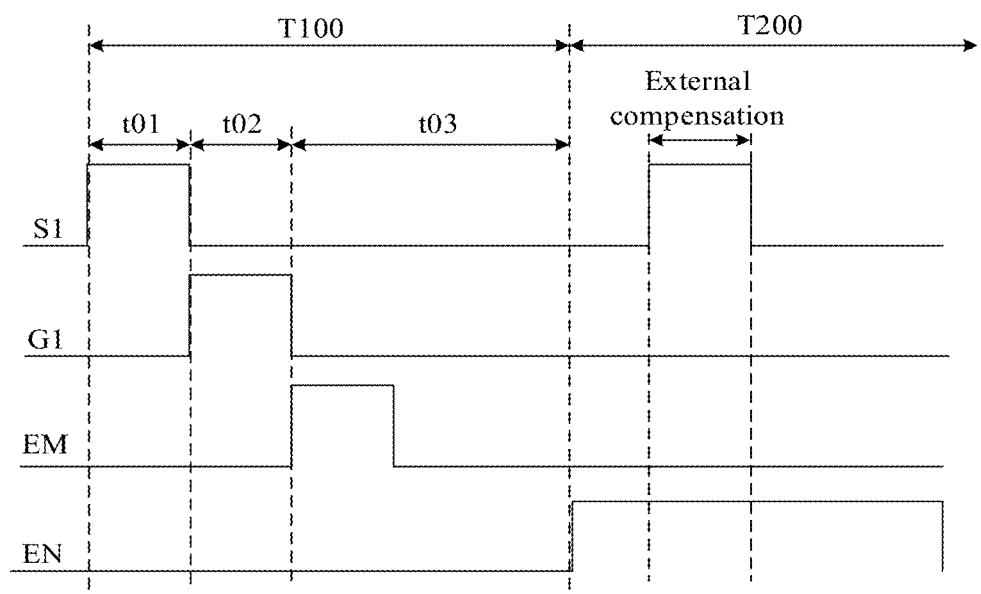
FIG. 19 is a time sequence diagram of signal terminals coupled to a pixel circuit according to an embodiment of the present disclosure.

The driving process of the pixel circuit is described below by taking the pixel circuit shown in FIG. 18 and each transistor in the pixel circuit being an N-type transistor as an example. FIG. 19 is a time sequence diagram of signal terminals coupled to a pixel circuit according to an embodiment of the present disclosure. There are two phases in total: a display phase T100 and a blanking phase T200. The display phase T100 may include an initialization phase t01, a data writing phase t02, and a light-emitting phase t03.

Referring to FIG. 19, in the initialization phase t01, the potential of the scan signal provided by the scan signal line S1 may be the first potential, and the compensation transistor K4 is turned on, such that the detection signal line S0 may transmit the detection signal at the second potential to the second node P2 through the compensation transistor K4 that is turned on to reset the second node P2. Additionally, in the initialization phase t01, the shift register unit 00 may provide the light-emission control signal at the second potential to the light-emission control line EM, that is, the potential of the light-emission control signal provided by the light-emission control line EM is the second potential, and the light-emission control transistor K3 is turned off. Moreover, the potential of the gate drive signal provided by the gate line G1 is the second potential, and the switch transistor K1 is turned off. Further, the drive transistor K2 is also turned off.

In the data writing phase t02, the shift register unit 00 still provides the light-emission control signal at the second potential to the light-emission control line EM, that is, the potential of the light-emission control signal maintains at the second potential, and the light-emission control transistor K3 is kept off. The potential of the scan signal jumps to the second potential, and the compensation transistor K4 is turned off. The potential of the gate drive signal jumps to the first potential, and the switch transistor K1 is turned on. In this way, the data signal provided by the data line D1 may be transmitted to the first node P1 through the switch transistor K1 that is turned on to charge the first node P1.

In the light-emitting phase t03, the potential of the scan signal maintains at the second potential, and the compensation transistor K4 is kept off. The potential of the gate drive signal jumps to the second potential, and the switch transistor K1 is turned off. At this point, the shift register unit 00 may provide the light-emission control signal at the first potential to the light-emission control line EM, that is, the potential of the light-emission control signal jumps to the first potential, and the light-emission control transistor K3 is turned on. The potential of the first node P1 maintains at the first potential under the bootstrap action of the storage capacitor C0, and the drive transistor K2 is turned on. The drive transistor K2 transmits the drive current to the second node P2 based on the potential of the first node P1 and the drive power signal provided by the drive power terminal Vdd. The drive current is then transmitted to the light-emitting element L0 through the light-emission control transistor K3 that is turned on, and the light-emitting element L0 emits light.

In the blanking phase T200, the shift register unit 00 may provide the light-emission control signal at the second potential to the light-emission control line EM, that is, the potential of the light-emission control signal jumps to the second potential, and the light-emission control transistor K3 is turned off. The potential of the gate drive signal maintains at the second potential, and the switch transistor K1 is turned off. The potential of the scan signal jumps to the first potential, and the compensation transistor K4 is turned on. In this case, the potential of the second node P2 may be transmitted to the detection signal line S0 through the compensation transistor K4 that is turned on, and then the detection signal line S0 transmits the acquired potential of the second node P2 to the coupled external compensation circuit such that the external compensation circuit externally compensates the data signal provided to the data line D1 based on the potential of the second node P2.

Optionally, FIG. 19 further shows a time sequence of the enable control terminal EN coupled to the shift register unit.

In the display phase T100, the enable control terminal EN may continuously provide the enable control signal ay the second potential. In the blanking phase T200, the potential of the enable control signal may jump to the first potential. In this case, in combination with FIG. 8, the first transistor T1 in the shift register unit 00 is turned on, and the second power signal at the second potential may be reliably transmitted to the output terminal Eout through the first transistor T1 that is turned on. Because the output terminal Eout of the shift register unit 00 is coupled to the light-emission control line EM, it is effectively ensured that the light-emission control line EM can reliably receive the light-emission control signal at the second potential in the blanking phase, that is, it is ensured that the light-emission control signal can maintain a stable low level in the blanking phase.

FIG. 20 is a flowchart of a method for driving a shift register unit in a display panel according to an embodiment of the present disclosure. This method may be applied to the shift register unit 00 shown in the foregoing figures. As shown in FIG. 20, the method may include the following steps.

In step 2001, in an input phase, a first shift circuit controls a potential of a shift node to be a second potential in response to a first clock signal at a first potential, a second clock signal at the second potential, an input signal at the first potential, a first power signal at the first potential, and a second power signal at the second potential; and a second shift circuit controls a first power terminal to be conducted with an output terminal in response to the second potential of the shift node, the first clock signal at the first potential, the second clock signal at the second potential, the first power signal, and the second power signal, controls a third clock terminal to be conducted with the output terminal in response to an output control signal at the first potential, and controls a second power terminal to be non-conducted with the output terminal in response to an enable control signal at the second potential.

In step 2002, in an output phase, the first shift circuit controls the potential of the shift node to be the first potential in response to the first clock signal at the second potential, the second clock signal at the first potential, the input signal at the second potential, the first power signal, and the second power signal; and the second shift circuit controls the first power terminal to be non-conducted with the output terminal in response to the first potential of the shift node, the first clock signal at the second potential, the second clock signal at the first potential, the first power signal, and the second power signal, controls the third clock terminal to be conducted with the output terminal in response to the output control signal at the first potential, and controls the second power terminal to be non-conducted with the output terminal in response to the enable control signal at the second potential.

In step 2003, in a first pull-down phase, the first shift circuit controls the potential of the shift node to be the second potential in response to the first clock signal at the first potential, the second clock signal at the second potential, the input signal at the second potential, the first power signal, and the second power signal; and the second shift circuit controls the first power terminal to be conducted with the output terminal in response to the second potential of the shift node, the first clock signal at the first potential, the second clock signal at the second potential, the first power signal, and the second power signal, controls the third clock terminal to be non-conducted with the output terminal in response to the output control signal at the second potential, and controls the second power terminal to be non-conducted with the output terminal in response to the enable control signal at the second potential.

With reference to FIG. 19, in this embodiment of the present disclosure, the input phase, the output phase, and the first pull-down phase may be sequentially performed in the display phase T100 of the pixel circuit.

Optionally, referring to the flowchart of another method for driving a shift register unit in FIG. 21, after the first pull-down phase, i.e., after step 2003, the method may further include the following steps.

In step 2004, in a second pull-down phase, the first shift circuit controls the potential of the shift node to be the second potential in response to the first clock signal at the second potential, the second clock signal at the second potential, the input signal at the first potential, the first power signal, and the second power signal; and the second shift circuit controls the first power terminal to be non-conducted with the output terminal in response to the second potential of the shift node, the first clock signal at the second potential, the second clock signal at the second potential, the first power signal, and the second power signal, controls the third clock terminal to be non-conducted with the output terminal in response to the output control signal at the second potential, and controls the second power terminal to be conducted with the output terminal in response to the enable control signal at the first potential.

In the input phase, a potential of a third clock signal provided by the third clock terminal is the first potential. In the output phase, the potential of the third clock signal is the second potential. In the first pull-down phase, the potential of the third clock signal is the first potential. In the second pull-down phase, the potential of the third clock signal is the second potential. With reference to FIG. 19, in the embodiments of the present disclosure, the second pull-down phase may be performed in the blanking phase T200 of the pixel circuit.

Figure 22:
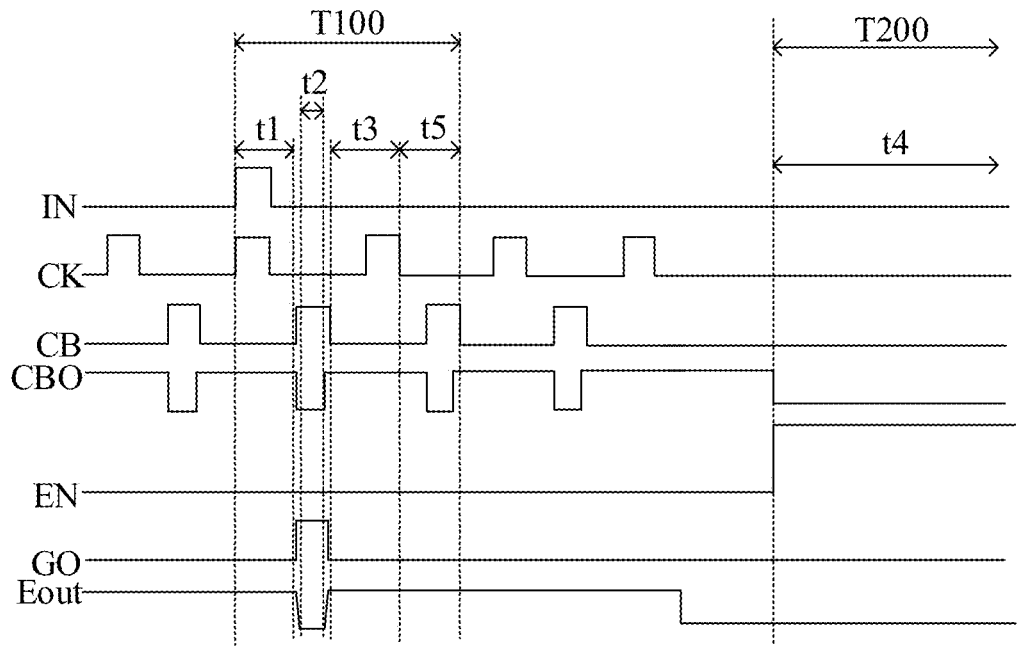
FIG. 22 is a time sequence diagram of signal terminals coupled to a shift register unit according to an embodiment of the present disclosure.

The driving principle of the shift register unit is described below by taking the shift register unit shown in FIG. 8 and each transistor in the shift register unit being an N-type transistor as an example. FIG. 22 is a time sequence diagram of the signal terminals coupled to the shift register unit and of the shift node GO.

Referring to FIG. 22, in the input phase t1, the potential of the input signal provided by the input signal terminal IN, the potential of the first clock signal provided by the first clock terminal CK, and the potential of the third clock signal provided by the third clock terminal CBO are all the first potential; and the potential of the second clock signal provided by the second clock terminal CB and the potential of the enable control signal provided by the enable control terminal EN are both the second potential. Correspondingly, the fifth transistor T5, the eighth transistor T8, and the ninth transistor T9 are all turned on, and the first transistor T1 and the twelfth transistor T12 are both turned off. Moreover, the fourteenth transistor T14 is turned on under the control of the first power signal at the first potential.

On the basis of turn-on and turn-off of the foregoing transistors, the first power signal at the first potential is transmitted to the pull-up node PU through the eighth transistor T8 that is turned on, the thirteenth transistor T13 is turned on, the second power signal at the second potential is transmitted to the shift node GO through the thirteenth transistor T13 that is turned on, and the input signal at the first potential is transmitted to the second pull-down node PD2 through the ninth transistor T9 that is turned on. Correspondingly, the tenth transistor T10 is turned on, and the first clock signal at the first potential is transmitted to the pull-up node PU through the tenth transistor T10 that is turned on. The input signal at the first potential that is written to the second pull-down node PD2 continues to be transmitted to the gate of the fifteenth transistor T15 through the fourteenth transistor T14 that is turned on. Correspondingly, the fifteenth transistor T15 is turned on, and the second clock signal at the second potential is transmitted to the shift node GO through the fifteenth transistor T15 that is turned on. The fourth transistor T4 and the sixth transistor T6 are both turned off. The first power signal at the first potential is transmitted to the pull-down reference node PD0 through the fifth transistor T5 that is turned on. Correspondingly, the seventh transistor T7 is turned on. The first power signal at the first potential that is written to the pull-down reference node PD0 continues to be transmitted to the first pull-down node PD1 through the seventh transistor I7 that is turned on. The third transistor T3 is turned on. The first power signal at the first potential is transmitted to the output terminal Eout through the third transistor T3 that is turned on. Because the output control terminal CN_O is coupled to the gate of the fifteenth transistor T15, the potential of the output control signal provided by the output control terminal CN_O is also the first potential. The second transistor T2 is turned on, and the third clock signal at the first potential is transmitted to the output terminal Eout through the second transistor T2 that is turned on.

In the output phase t2, the potential of the second clock signal jumps to the first potential, the potential of the input signal, the potential of the first clock signal, and the potential of the third clock signal all jump to the second potential, and the potential of the enable control signal maintains at the second potential. Correspondingly, the first transistor T1, the fifth transistor T5, the eighth transistor T8, and the ninth transistor T9 are all turned off, and the twelfth transistor T12 is turned on. The first potential at the gate of the fifteenth transistor T15 maintains at the relatively high first potential under the bootstrap action of the fourth capacitor C4. In this case, the first potential at the gate of the fifteenth transistor T15 is higher than the first potential provided by the first power signal. Therefore, the fourteenth transistor T14 is turned off, and the second transistor T2 keeps being turned on.

On the basis of turn-on and turn-off of the foregoing transistors, it can be learned with reference to the descriptions of the foregoing input phase t1 that the second clock signal at the first potential may be transmitted to the shift node GO through the fifteenth transistor T15 that is turned on. Correspondingly, the fourth transistor T4 and the sixth transistor T6 are turned on. The second power signal at the second potential is transmitted to the pull-down reference node PD0 through the fourth transistor T4 that is turned on, and is transmitted to the first pull-down node PD1 through the sixth transistor T6 that is turned on. Correspondingly, the seventh transistor T7 and the third transistor T3 are turned off. The third clock signal at the second potential is transmitted to the output terminal Eout through the second transistor 12 that is turned on.

In the first pull-down phase t3, the potential of the input signal and the potential of the enable control signal maintain at the second potential, the potential of the first clock signal and the potential of the third clock signal jump to the first potential, and the potential of the second clock signal jumps to the second potential. Correspondingly, the fifth transistor T5, the eighth transistor T8, and the ninth transistor T9 are all turned on, and the first transistor T1 and the twelfth transistor T12 are both turned off. The fourteenth transistor T14 is turned on under the control of the first power signal at the first potential.

On the basis of turn-on and turn-off of the foregoing transistors, the input signal at the second potential is transmitted to the second pull-down node PD2 through the ninth transistor T9 that is turned on, and the tenth transistor T10 is turned off. The input signal at the second potential continues to be transmitted to the gate of the fifteenth transistor T15 through the fourteenth transistor T14 that is turned on, and the fifteenth transistor T15 and the second transistor T2 are both turned off. The first power signal at the first potential is transmitted to the pull-up node PU through the eighth transistor T8 that is turned on, and the thirteenth transistor T13 and the eleventh transistor T11 are both turned on. The second power signal at the second potential is transmitted to the shift node GO through the thirteenth transistor T13 that is turned on. Correspondingly, the fourth transistor T4 and the sixth transistor T6 are both turned off. The first power signal at the first potential is transmitted to the pull-down reference node PD0 through the fifth transistor T5 that is turned on. Correspondingly, the seventh transistor 17 is turned on. The first power signal at the first potential that is written to the pull-down reference node PD0 continues to be transmitted to the first pull-down node PD1 through the seventh transistor T7 that is turned on. The third transistor T3 is turned on. The first power signal at the first potential is transmitted to the output terminal Eout through the third transistor T3 that is turned on.

In the second pull-down phase t4, the potential of the enable control signal jumps to the first potential, and the potentials of the other signals are all the second potential. Correspondingly, only the first transistor T1 is turned on, and the second power signal at the second potential is transmitted to the output terminal Eout through the first transistor T1 that is turned on.

It should be noted that a denoising phase t5 may further be included between the first pull-down phase t3 and the second pull-down phase t4. In the denoising phase t5, the potential of the input signal and the potential of the enable control signal both maintain at the first potential, the potential of the first clock signal and the potential of the third clock signal jump to the second potential, and the potential of the second clock signal jumps to the first potential.

Correspondingly, the first transistor T1, the fifth transistor T5, the eighth transistor T8, and the ninth transistor T9 are all turned off, and the twelfth transistor T12 is turned on. The fourteenth transistor T14 is turned on under the control of the first power signal at the first potential.

On the basis of turn-on and turn-off of the foregoing transistors, the potential of the first power signal at the first potential that is written to the pull-up node PU becomes higher under the bootstrap action of the second capacitor C2, that is, maintains at the first potential. Correspondingly, the thirteenth transistor T13 and the eleventh transistor T11 are both turned on. The second power signal at the second potential is transmitted to the second pull-down node PD2 through the eleventh transistor T11 and the twelfth transistor T12 that are turned on. The second power signal at the second potential that is written to the second pull-down node PD2 continues to be transmitted to the gate of the fifteenth transistor T15 through the fourteenth transistor T14 that is turned on. The second transistor T2 and the fifteenth transistor T15 are both turned off. The second power signal at the second potential is transmitted to the shift node GO through the thirteenth transistor T13 that is turned on. Correspondingly, the fourth transistor T4 and the sixth transistor T6 are both turned off. In addition, under the bootstrap action of the first capacitor C1, the first power signal at the first potential that is written to the pull-down reference node PD0 in the previous phase becomes higher, that is, the potential of the pull-down reference node PD0 maintains at the first potential in this phase. Correspondingly, the seventh transistor T7 is turned on. The first power signal at the first potential at the pull-down reference node PD0 is continuously transmitted to the first pull-down node PD1 through the seventh transistor T7 that is turned on. The third transistor T3 is turned on. The first power signal at the first potential is transmitted to the output terminal Eout through the third transistor T3 that is turned on.

It should be noted that, through testing, in the first pull-down phase t3, the potential Vpd0 of the pull-down reference node PD0 is generally Vgh−Vth1, and the potential Vpd1 of the first pull-down node PD1 is generally Vgh−Vth2. In the denoising phase t5, the potential Vpd0 of the pull-down reference node PD0 is pulled to Vgh−Vth1+(Vgh−Vgl) by the second clock signal. Correspondingly, the potential Vpd1 of the first pull-down node PD1 is charged to Vpd0−Vth2, which is much higher than Vgh+Vth3. Further, the third transistor T3 is reliably turned on.

Vth1 represents the threshold voltage of the fifth transistor T5, Vth2 represents the threshold voltage of the seventh transistor T7, and Vth3 represents the threshold voltage of the third transistor T3. Vgh represents the potential value of the first power signal, and Vgl represents the potential value of the second power signal.

It should be noted that with reference to FIG. 19 and FIG. 22, the denoising phase t5 may be performed in the display phase T100 of the pixel circuit. The input phase t1, the output phase t2, the first pull-down phase t3, and the denoising phase t5 described in the foregoing embodiments are sequentially performed in the display phase T100. That is, in the display phase T100 of the pixel circuit, first, the input phase t1 may be performed; then, the output phase t2 may be performed; next, the first pull-down phase t3 may be performed; and finally, the denoising phase t5 may be performed. Only the second pull-down phase t4 is performed in the blanking phase T200 of the pixel circuit.

Optionally, it can be learned with reference to FIG. 22 that a cycle of the second clock signal may be the same as a cycle of the third clock signal. In the output phase t2, a duty cycle of the second clock signal is greater than a duty cycle of the third clock signal. That is, in the output phase t2, a pulse width of the second clock signal is greater than a pulse width of the third clock signal. In other words, duration of the second clock signal at the first potential is greater than the duration of the third clock signal at the second potential. In this way, the second transistor T2 may be turned on, after the fifteenth transistor T15 is sufficiently turned on. That is, the third transistor T3 is effectively turned off under the control of the second potential of the first pull-down node PD1. After it is ensured that the first power signal at the first potential is not transmitted to the output terminal Eout through the third transistor T3, the third clock signal at the second potential is controlled to be transmitted to the output terminal Eout through the second transistor T2 that is turned on. In this way, the first power signal at the first potential transmitted by the first power terminal VGH coupled to the third transistor T3 is effectively prevented from interfering with the output terminal Eout in the output phase t2, which further improves the output waveform of the output terminal Eout. After testing, after the waveform is improved, a falling edge of the signal output by the output terminal Eout becomes smaller.

In addition, when the output phase t2 transitions to the first pull-down phase t3, the potential of the third clock signal needs to increase to the first potential. In the case that the second transistor T2 is a dual-gate transistor, the second transistor 12 cannot be sufficiently and quickly turned on, and a step phenomenon occurs when the output terminal Eout jumps from the second potential to the first potential. In the first pull-down phase t3, the first potential Vpd1 of the first pull-down node PD1 is generally Vgh−Vth1−Vth2, and Vpd1 is smaller than Vgh. Therefore, the third transistor T3 is insufficiently turned on. Correspondingly, the first power signal at the first potential cannot be transmitted to the output terminal Eout through the third transistor T3. That is, the potential of the output terminal Eout cannot be quickly replenished to the first potential, and duration of the step phenomenon that occurs in the first potential of the output terminal Eout is long. In the present disclosure, by setting the second transistor T2 to be a single-gate transistor, the step phenomenon can be effectively prevented from occurring when the potential of the output terminal Eout jumps from the second potential to the first potential, which improves the output waveform of the output terminal Eout.

Figure 23:
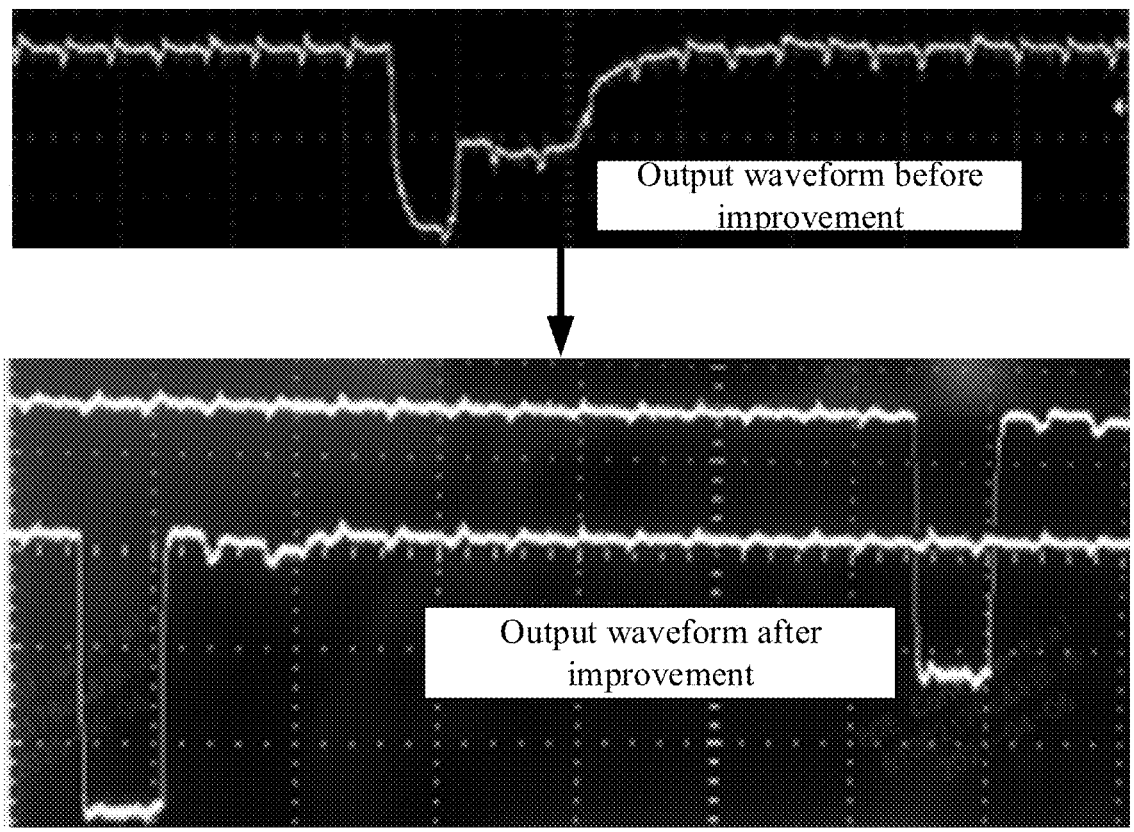
FIG. 23 is a comparison diagram of waveforms of an output terminal of a shift register unit before and after improvement according to an embodiment of the present disclosure.

For example, FIG. 23 shows output waveforms of the output terminal Eout before and after improvement. It can be learned from FIG. 23 that in the case that the second transistor 12 is set to be a dual-gate transistor, the step phenomenon occurs when the output terminal Eout jumps from the second potential to the first potential. However, in the case that the second transistor T2 is set to be a single-gate transistor, the output terminal Eout can directly jump from the second potential to the first potential, and no step phenomenon occurs.

Optionally, the display apparatus in the embodiments of the present disclosure may be any product or component with a display function, such as an organic light-emitting diode (OLED) display apparatus, a mobile phone, a tablet computer, a TV, a display, a notebook computer, or a digital photo frame.

Optionally, the "first", "second", "third", and similar words in the embodiments of the present disclosure do not denote any order, quantity, or importance, but are merely intended to distinguish between different components.

Similarly, the terms "one", "a/an", and similar words are not intended to be limit the quantity, but rather denote the presence of at least one.

"Comprising", "including", and similar words mean that the element or article appearing before "comprising" or "including" includes the elements or articles and their equivalent elements appearing behind "comprising" or "including", without excluding any other elements or articles.

"Connected", "conducted", and similar words are not limited to physical or mechanical connections, but may include direct and indirect electrical connections.

"Upper", "lower", "left", "right", and the like are merely used to indicate a relative positional relationship, and when the absolute position of the described object is changed, the relative positional relationship is also changed accordingly.

The foregoing descriptions are merely optional embodiments of the present disclosure and are not intended to limit the present disclosure. Any modification, equivalent substitutions, and improvement within the spirit and principle of the present disclosure shall be included within the protection scope of the present disclosure.

What is claimed is:

1. A display panel, comprising:
 a substrate, comprising a display region and a non-display region surrounding the display region; and
 a shift register unit, disposed in the non-display region;
 wherein the shift register unit comprises a first shift circuit and a second shift circuit; wherein
 the first shift circuit is coupled to a first clock terminal, a second clock terminal, an input signal terminal, a first power terminal, a second power terminal, and a shift node, and the first shift circuit is configured to control a potential of the shift node in response to a first clock signal provided by the first clock terminal, a second clock signal provided by the second clock terminal, an input signal provided by the input signal terminal, a first power signal provided by the first power terminal, and a second power signal provided by the second power terminal; and
 the second shift circuit is coupled to the shift node, the first clock terminal, the second clock terminal, a third clock terminal, an enable control terminal, an output control terminal, the first power terminal, the second power terminal, and an output terminal, and the second shift circuit is configured to control the first power terminal to be conducted with or non-conducted with the output terminal in response to the potential of the shift node, the first clock signal, the second clock signal, the first power signal, and the second power signal, control the third clock terminal to be conducted with or non-conducted with the output terminal in response to an output control signal provided by the output control terminal, and control the second power terminal to be conducted with or non-conducted with the output terminal in response to an enable control signal provided by the enable control terminal.

2. The display panel according to claim 1, wherein the second shift circuit is configured to:
control the second power terminal to be non-conducted with the output terminal in response to the enable control signal at a second potential in a display phase of a pixel circuit coupled to the shift register unit; and
control the second power terminal to be conducted with the output terminal in response to the enable control signal at a first potential in a blanking phase of the pixel circuit coupled to the shift register unit.

3. The display panel according to claim 1, wherein the second shift circuit comprises a first output control sub-circuit, a second output control sub-circuit, and a first output sub-circuit; wherein
the first output control sub-circuit is coupled to the shift node, the first clock terminal, the second clock terminal, the first power terminal, the second power terminal, and the output terminal, and the first output control sub-circuit is configured to control the first power terminal to be conducted with or non-conducted with the output terminal in response to the potential of the shift node, the first clock signal, the second clock signal, the first power signal, and the second power signal;
the second output control sub-circuit is coupled to the enable control terminal, the second power terminal, and the output terminal, and the second output control sub-circuit is configured to control the second power terminal to be conducted with or non-conducted with the output terminal in response to the enable control signal; and
the first output sub-circuit is coupled to the output control terminal, the third clock terminal, and the output terminal, and the first output sub-circuit is configured to control the third clock terminal to be conducted with or non-conducted with the output terminal in response to the output control signal.

4. The display panel according to claim 3, wherein the second output control sub-circuit comprises a first transistor; wherein
a gate of the first transistor is coupled to the enable control terminal, a first electrode of the first transistor is coupled to the second power terminal, and a second electrode of the first transistor is coupled to the output terminal.

5. The display panel according to claim 3, wherein the first output sub-circuit comprises a second transistor, and the second transistor is a single-gate transistor; wherein
a gate of the second transistor is coupled to the output control terminal, a first electrode of the second transistor is coupled to the third clock terminal, and a second electrode of the second transistor is coupled to the output terminal.

6. The display panel according to claim 3, wherein the first output control sub-circuit comprises a first denoising control sub-circuit, a second denoising control sub-circuit, and a denoising sub-circuit; wherein
the first denoising control sub-circuit is coupled to the shift node, the first clock terminal, the second clock terminal, the first power terminal, the second power terminal, and a pull-down reference node, and the first denoising control sub-circuit is configured to control the second power terminal to be conducted with or non-conducted with the pull-down reference node in response to the potential of the shift node, control the first power terminal to be conducted with or non-conducted with the pull-down reference node in response to the first clock signal, and control a potential of the pull-down reference node based on the second clock signal;
the second denoising control sub-circuit is coupled to the shift node, the first power terminal, the second power terminal, the pull-down reference node, and a first pull-down node, and the second denoising control sub-circuit is configured to control the second power terminal to be conducted with or non-conducted with the first pull-down node in response to the potential of the shift node, control the pull-down reference node to be conducted with or non-conducted with the first pull-down node in response to the potential of the pull-down reference node, and control a potential of the first pull-down node based on the first power signal; and
the denoising sub-circuit is coupled to the first pull-down node, the first power terminal, and the output terminal, and the denoising sub-circuit is configured to control the first power terminal to be conducted with or non-conducted with the shift node in response to the potential of the first pull-down node.

7. The display panel according to claim 6, wherein the denoising sub-circuit comprises a third transistor, and the third transistor is a single-gate transistor; wherein
a gate of the third transistor is coupled to the first pull-down node, a first electrode of the third transistor is coupled to the first power terminal, and a second electrode of the third transistor is coupled to the output terminal.

8. The display panel according to claim 6, wherein the first denoising control sub-circuit comprises a fourth transistor, a fifth transistor, and a first capacitor; and the second denoising control sub-circuit comprises a sixth transistor, a seventh transistor, and a second capacitor; wherein
a gate of the fourth transistor and a gate of the sixth transistor are both coupled to the shift node, a first electrode of the fourth transistor and a first electrode of the sixth transistor are both coupled to the second power terminal, and a second electrode of the fourth transistor is coupled to the pull-down reference node, and a second electrode of the sixth transistor is coupled to the first pull-down node;
a gate of the fifth transistor is coupled to the first clock terminal, a first electrode of the fifth transistor is coupled to the first power terminal, and a second electrode of the fifth transistor is coupled to the pull-down reference node;
a gate and a first electrode of the seventh transistor are both coupled to the pull-down reference node, and a second electrode of the seventh transistor is coupled to the first pull-down node;
one end of the first capacitor is coupled to the pull-down reference node and the other end of the first capacitor is coupled to the second clock terminal; and
one end of the second capacitor is coupled to the first pull-down node and the other end of the second capacitor is coupled to the first power terminal.

9. The display panel according to claim 1, wherein the first shift circuit comprises an input sub-circuit, a control sub-circuit, and a second output sub-circuit; wherein
the input sub-circuit is coupled to the first clock terminal, the first power terminal, the input signal terminal, a pull-up node, and a second pull-down node, and the input sub-circuit is configured to control the first power terminal to be conducted with or non-conducted with the pull-up node and control the input signal terminal to be conducted with or non-conducted with the second pull-down node in response to the first clock signal;

the control sub-circuit is coupled to the pull-up node, the second pull-down node, the first clock terminal, the second clock terminal, and the second power terminal, and the control sub-circuit is configured to control the second power terminal to be conducted with or non-conducted with the second pull-down node in response to a potential of the pull-up node and the second clock signal, and control the first clock terminal to be conducted with or non-conducted with the pull-up node in response to a potential of the second pull-down node; and the second output sub-circuit is coupled to the pull-up node, the second pull-down node, the first power terminal, the second power terminal, the second clock terminal, and the shift node, and the second output sub-circuit is configured to control the second power terminal to be conducted with or non-conducted with the shift node in response to the potential of the pull-up node, and control the second clock terminal to be conducted with or non-conducted with the shift node in response to the potential of the second pull-down node and the first power signal.

10. The display panel according to claim 9, wherein the input sub-circuit comprises an eighth transistor and a ninth transistor; the control sub-circuit comprises a tenth transistor, an eleventh transistor, and a twelfth transistor; the second output sub-circuit comprises a thirteenth transistor, a fourteenth transistor, a fifteenth transistor, a third capacitor, and a fourth capacitor; wherein a gate of the eighth transistor and a gate of the ninth transistor are both coupled to the first clock terminal, a first electrode of the eighth transistor is coupled to the first power terminal, and a second electrode of the eighth transistor is coupled to the pull-up node, a first electrode of the ninth transistor is coupled to the input signal terminal, and a second electrode of the ninth transistor is coupled to the second pull-down node;

a gate of the tenth transistor is coupled to the second pull-down node, a first electrode of the tenth transistor is coupled to the first clock terminal, and a second electrode of the tenth transistor is coupled to the pull-up node;

a gate of the eleventh transistor is coupled to the pull-up node, a first electrode of the eleventh transistor is coupled to the second power terminal, and a second electrode of the eleventh transistor is coupled to a first electrode of the twelfth transistor, and a gate of the twelfth transistor is coupled to the second clock terminal and a second electrode of the twelfth transistor is coupled to the second pull-down node;

a gate of the thirteenth transistor is coupled to the pull-up node, a first electrode of the thirteenth transistor is coupled to the second power terminal, and a second electrode of the thirteenth transistor is coupled to the shift node;

a gate of the fourteenth transistor is coupled to the first power terminal, a first electrode of the fourteenth transistor is coupled to the second pull-down node, and a second electrode of the fourteenth transistor is coupled to a gate of the fifteenth transistor, and a first electrode of the fifteenth transistor is coupled to the second clock terminal and a second electrode of the fifteenth transistor is coupled to the shift node;

one end of the third capacitor is coupled to the pull-up node and the other end of the third capacitor is coupled to the second power terminal; and one end of the fourth capacitor is coupled to the gate of the fifteenth transistor and the other end of the fourth capacitor is coupled to the shift node.

11. The display panel according to claim 10, wherein the output control terminal is coupled to the gate of the fifteenth transistor.

12. The display panel according to claim 1, wherein transistors in the shift register unit are all N-type transistors.

13. The display panel according to claim 1, wherein the shift register unit comprises a semiconductor layer, a first conductive layer, a second conductive layer, and a third conductive layer which are disposed on a side of the substrate; wherein the semiconductor layer at least comprises a channel region, a source region, and a drain region of at least one transistor in the shift register unit;

the first conductive layer at least comprises a gate of at least one transistor and a first capacitive electrode of at least one capacitor in the shift register unit, the gate and a channel region of the at least one transistor being overlapped;

the second conductive layer at least comprises a second capacitive electrode of at least one capacitor in the shift register unit, the second capacitive electrode and a first capacitive electrode of the at least one capacitor being overlapped; and the third conductive layer at least comprises a plurality of signal lines, and a source and a drain of at least one transistor in the shift register unit; wherein the source and a source region of the at least one transistor are coupled, and the drain and a drain region of the at least one transistor are coupled; and the plurality of signal lines are coupled to signal terminals coupled to the shift register unit, respectively.

14. The display panel according to claim 13, wherein the plurality of signal lines comprise a first group of signal lines, a second group of signal lines, and a third group of signal lines that are sequentially spaced in a first direction; wherein the first group of signal lines comprises a first power line coupled to the first power terminal;

the second group of signal lines comprises an enable control line coupled to the enable control terminal; and the third group of signal lines comprises the first power line;

wherein the first group of signal lines, a first group of transistors in the shift register unit, a first group of capacitors in the shift register unit, the second group of signal lines, a second group of transistors in the shift register unit, a second group of capacitors in the shift register unit, and the third group of signal lines are sequentially arranged in the first direction; and at least one of the plurality of signal lines extends in a second direction, the first direction being a direction from the non-display region to the display region, and the second direction intersecting the first direction.

15. The display panel according to claim 14, wherein the first group of signal lines further comprises an input signal line coupled to the input signal terminal, a first clock signal line coupled to the first clock terminal, and a second clock signal line coupled to the second clock terminal;

the second group of signal lines further comprises a second power line coupled to the second power terminal, the first clock signal line, and the second clock signal line; and the third group of signal lines further comprises a third clock signal line coupled to the third clock terminal; and wherein in the first direction, the input signal line, the first clock signal line, the second clock signal line, and the first power line in the first group of signal lines are sequentially arranged, the second power line, the enable control line, the second clock signal line, and the first clock signal line in the second group of signal lines are sequentially arranged, and the first power line and the third clock signal line in the third group of signal lines are sequentially arranged.

16. The display panel according to claim 14, wherein the first group of transistors comprises a sixth transistor, an eighth transistor, a ninth transistor, a tenth transistor, an eleventh transistor, a twelfth transistor, a thirteenth transistor, and a fifteenth transistor in the shift register unit;

the first group of capacitors comprises a third capacitor and a fourth capacitor in the shift register unit;

the second group of transistors comprises a first transistor, a second transistor, a third transistor, a fourth transistor, the fifth transistor, and a seventh transistor in the shift register unit; and the second group of capacitors comprises a first capacitor and a second capacitor in the shift register unit.

17. A method for driving a shift register unit in a display panel, applied to the shift register unit;

wherein the shift register unit comprises a first shift circuit and a second shift circuit; wherein the first shift circuit is coupled to a first clock terminal, a second clock terminal, an input signal terminal, a first power terminal, a second power terminal, and a shift node, and the first shift circuit is configured to control a potential of the shift node in response to a first clock signal provided by the first clock terminal, a second clock signal provided by the second clock terminal, an input signal provided by the input signal terminal, a first power signal provided by the first power terminal, and a second power signal provided by the second power terminal; and the second shift circuit is coupled to the shift node, the first clock terminal, the second clock terminal, a third clock terminal, an enable control terminal, an output control terminal, the first power terminal, the second power terminal, and an output terminal, and the second shift circuit is configured to control the first power terminal to be conducted with or non-conducted with the output terminal in response to the potential of the shift node, the first clock signal, the second clock signal, the first power signal, and the second power signal, control the third clock terminal to be conducted with or non-conducted with the output terminal in response to an output control signal provided by the output control terminal, and control the second power terminal to be conducted with or non-conducted with the output terminal in response to an enable control signal provided by the enable control terminal, the method comprises:

in an input phase, controlling, by the first shift circuit, a potential of the shift node to be the second potential in response to the first clock signal at a first potential, the second clock signal at the second potential, the input signal at the first potential, the first power signal at the first potential, and the second power signal at the second potential; and controlling, by the second shift circuit, the first power terminal to be conducted with the output terminal in response to the second potential of the shift node, the first clock signal at the first potential, the second clock signal at the second potential, the first power signal and the second power signal, the third clock terminal to be conducted with the output terminal in response to the output control signal at the first potential, and the second power terminal to be non-conducted with the output terminal in response to the enable control signal at the second potential, wherein a potential of a third clock signal provided by the third clock terminal is the first potential;

in an output phase, controlling, by the first shift circuit, the potential of the shift node to be the first potential in response to the first clock signal at the second potential, the second clock signal at the first potential, the input signal at the second potential, the first power signal, and the second power signal; and controlling, by the second shift circuit, the first power terminal to be non-conducted with the output terminal in response to the first potential of the shift node, the first clock signal at the second potential, the second clock signal at the first potential, the first power signal and the second power signal, the third clock terminal to be conducted with the output terminal in response to the output control signal at the first potential, and the second power terminal to be non-conducted with the output terminal in response to the enable control signal at the second potential, wherein the potential of the third clock signal is the second potential; and in a first pull-down phase, controlling, by the first shift circuit, the potential of the shift node to be the second potential in response to the first clock signal at the first potential, the second clock signal at the second potential, the input signal at the second potential, the first power signal, and the second power signal; and controlling, by the second shift circuit, the first power terminal to be conducted with the output terminal in response to the second potential of the shift node, the first clock signal at the first potential, the second clock signal at the second potential, the first power signal and the second power signal, the third clock terminal to be non-conducted with the output terminal in response to the output control signal at the second potential, and the second power terminal to be non-conducted with the output terminal in response to the enable control signal at the second potential, wherein the potential of the third clock signal is the first potential;

wherein the input phase, the output phase, and the first pull-down phase are performed in a display phase of a pixel circuit coupled to the shift register unit.

18. The method according to claim 17, wherein after the first pull-down phase, the method further comprises:

in a second pull-down phase, controlling, by the first shift circuit, the potential of the shift node to be the second potential in response to the first clock signal at the second potential, the second clock signal at the second potential, the input signal at the first potential, the first power signal and the second power signal; and controlling, by the second shift circuit, the first power terminal to be non-conducted with the output terminal in response to the second potential of the shift node, the first clock signal at the second potential, the second clock signal at the second potential, the first power signal and the second power signal, the third clock terminal to be non-conducted with the output terminal in response to the output control signal at the second potential, and the second power terminal to be conducted with the output terminal in response to the enable control signal at the first potential, wherein the potential of the third clock signal is the second potential;

wherein the second pull-down phase is performed in a blanking phase of the pixel circuit.

19. The method according to claim 17, wherein a cycle of the second clock signal is the same as a cycle of the third clock signal, and in the output phase, a duty cycle of the second clock signal is greater than a duty cycle of the third clock signal.

20. A shift register, comprising at least two cascaded shift register units, wherein the shift register unit in a display panel comprises a first shift circuit and a second shift circuit; wherein the first shift circuit is coupled to a first clock terminal, a second clock terminal, an input signal terminal, a first power terminal, a second power terminal, and a shift node, and the first shift circuit is configured to control a potential of the shift node in response to a first clock signal provided by the first clock terminal, a second clock signal provided by the second clock terminal, an input signal provided by the input signal terminal, a first power signal provided by the first power terminal, and a second power signal provided by the second power terminal; and the second shift circuit is coupled to the shift node, the first clock terminal, the second clock terminal, a third clock terminal, an enable control terminal, an output control terminal, the first power terminal, the second power terminal, and an output terminal, and the second shift circuit is configured to control the first power terminal to be conducted with or non-conducted with the output terminal in response to the potential of the shift node, the first clock signal, the second clock signal, the first power signal, and the second power signal, control the third clock terminal to be conducted with or non-conducted with the output terminal in response to an output control signal provided by the output control terminal, and control the second power terminal to be conducted with or non-conducted with the output terminal in response to an enable control signal provided by the enable control terminal;

the shift node of the shift register unit at each stage is coupled to the input signal terminal of the shift register unit at a next stage, and the output terminal of the shift register unit at each stage is coupled to a target signal line, wherein the target signal line is a light-emission control line coupled to a pixel circuit in the display panel.

\* \* \* \* \*